United States Patent
Gonzalez et al.

(10) Patent No.: US 10,043,937 B2
(45) Date of Patent: Aug. 7, 2018

(54) SYSTEMS AND METHOD FOR PRECISION AUTOMATED PLACEMENT OF BACKSHEET ON PV MODULES

(71) Applicant: SolarCity Corporation, San Mateo, CA (US)

(72) Inventors: Pablo Gonzalez, Fremont, CA (US); Bobby Yang, Los Altos Hills, CA (US)

(73) Assignee: SolarCity Corporation, San Mateo, CA (US)

(*) Notice: Subject to any disclaimer, the term of this patent is extended or adjusted under 35 U.S.C. 154(b) by 158 days.

(21) Appl. No.: 14/877,870

(22) Filed: Oct. 7, 2015

(65) Prior Publication Data

US 2016/0163908 A1 Jun. 9, 2016

Related U.S. Application Data

(60) Provisional application No. 62/088,509, filed on Dec. 5, 2014, provisional application No. 62/143,694, filed on Apr. 6, 2015.

(51) Int. Cl.
*H05K 3/02* (2006.01)
*H05K 3/10* (2006.01)
(Continued)

(52) U.S. Cl.
CPC .......... *H01L 31/18* (2013.01); *H01L 31/049* (2014.12); *H01L 31/1876* (2013.01); *Y02E 10/50* (2013.01); *Y02P 70/521* (2015.11)

(58) Field of Classification Search
CPC .......... F24J 2/523; F24J 2/5237; F24J 2/5245; F24J 2002/5277; F24J 2002/5281;
(Continued)

(56) References Cited

U.S. PATENT DOCUMENTS 2,938,938 A    5/1960   Dickson, Jr.
3,116,171 A   12/1963   Nielsen et al.
(Continued)

FOREIGN PATENT DOCUMENTS

DE    32 38 187 A1   4/1984
DE    4030713 A1     4/1992
(Continued)

OTHER PUBLICATIONS

"Solar Cell Technologies| History, Working, Business Opportunities and Production Line," Webite of Energy Alternatives India (EAI), Tamilnadu, India. Retrieved from the Internet on Feb. 4, 2016, from http://webcache.googleusercontent.com/search?q=cache:4yv5UCQoCnMJ:www.eai.in/ref/global/ae/sol/celltech/cell_tech.html+&cd=3&hl=en&ct=clnk&gl=us (Google cache of http://www.eai.in/ref/global/ae/sol/celltech/cell_tech.html), 16 pages.
(Continued)

*Primary Examiner* — Paul D Kim
(74) *Attorney, Agent, or Firm* — Kilpatrick Townsend & Stockton LLP

(57) ABSTRACT

A method for constructing a photovoltaic (PV) substrate. A moving frame can be lowered towards a stack of back sheets and a back sheet of the stack of back sheets may be secured to the moving frame. The back sheet can be transferred from the moving frame to a vacuum table. An adhesive can be dispensed to the back sheet using an adhesive dispenser. At least one string may be placed onto the adhesive applied to the back sheet. The vacuum table can be rotated, and the back sheet can be released from the vacuum table onto a glass sheet.

20 Claims, 18 Drawing Sheets

(51) Int. Cl.
*H01L 31/18* (2006.01)
*H01L 31/049* (2014.01)

(58) Field of Classification Search
CPC ... H01L 31/049; H01L 31/18; H01L 31/1876; H02S 20/00; H02S 20/30
See application file for complete search history.

(56) References Cited

U.S. PATENT DOCUMENTS

| | | |
|---|---|---|
| 3,459,597 A | 8/1969 | Baron |
| 4,450,033 A | 5/1984 | Little |
| 4,577,051 A | 3/1986 | Hartman |
| 4,652,693 A | 3/1987 | Bar-On |
| 4,877,460 A | 10/1989 | Flödl |
| 5,118,361 A | 6/1992 | Fraas et al. |
| 5,178,685 A | 1/1993 | Borenstein et al. |
| 5,593,532 A | 1/1997 | Falk |
| 6,232,545 B1 | 5/2001 | Samaras et al. |
| 6,303,853 B1 | 10/2001 | Fraas et al. |
| 6,441,297 B1 | 8/2002 | Keller et al. |
| 6,538,193 B1 | 3/2003 | Fraas |
| 6,620,645 B2 | 9/2003 | Chandra et al. |
| 6,803,513 B2 | 10/2004 | Beernink et al. |
| 7,328,534 B2 | 2/2008 | Dinwoodie |
| 7,388,146 B2 | 6/2008 | Fraas et al. |
| 7,635,810 B2 | 12/2009 | Luch |
| 7,749,883 B2 | 7/2010 | Meeus |
| 7,772,484 B2 | 8/2010 | Li et al. |
| 7,777,128 B2 | 8/2010 | Montello et al. |
| 7,825,329 B2 | 11/2010 | Basol |
| 7,829,781 B2 | 11/2010 | Montello et al. |
| 7,829,785 B2 | 11/2010 | Basol |
| 7,872,192 B1 | 1/2011 | Fraas et al. |
| 7,872,193 B2 | 1/2011 | Ogawa et al. |
| 7,906,365 B2 | 3/2011 | Sonobe |
| 8,110,737 B2 * | 2/2012 | Luch ............... H01L 31/02008 136/244 |
| 8,168,880 B2 | 5/2012 | Jacobs |
| 8,209,920 B2 | 7/2012 | Krause et al. |
| 8,222,513 B2 | 7/2012 | Luch |
| 8,343,795 B2 | 1/2013 | Luo et al. |
| 8,586,857 B2 | 11/2013 | Everson et al. |
| 8,921,684 B2 | 12/2014 | Shimizu |
| 2001/0026349 A1 | 10/2001 | Furukawa et al. |
| 2003/0000571 A1 | 1/2003 | Wakuda et al. |
| 2003/0121228 A1 | 7/2003 | Stoehr et al. |
| 2003/0201007 A1 | 10/2003 | Fraas et al. |
| 2005/0257823 A1 | 11/2005 | Zwanenburg |
| 2007/0283997 A1 | 12/2007 | Hachtmann et al. |
| 2009/0314334 A1* | 12/2009 | Saha ............... H01L 31/02008 136/249 |
| 2010/0043863 A1 | 2/2010 | Wudu et al. |
| 2010/0147364 A1 | 6/2010 | Gonzalez et al. |
| 2010/0193014 A1 | 8/2010 | Johnson et al. |
| 2010/0218799 A1 | 9/2010 | Stefani |
| 2010/0218805 A1* | 9/2010 | Everett ............. H01L 31/02168 136/246 |
| 2010/0224230 A1 | 9/2010 | Luch et al. |
| 2010/0269891 A1* | 10/2010 | Kinard ............... F24J 2/5205 136/251 |
| 2011/0156188 A1 | 6/2011 | Tu et al. |
| 2011/0179619 A1 | 7/2011 | Weigl |
| 2011/0259419 A1 | 10/2011 | Hagemann et al. |
| 2011/0290300 A1 | 12/2011 | Battenhausen |
| 2012/0000502 A1 | 1/2012 | Wiedeman et al. |
| 2012/0040487 A1 | 2/2012 | Asthana et al. |
| 2012/0125391 A1 | 5/2012 | Pinarbasi et al. |
| 2012/0152349 A1 | 6/2012 | Cao et al. |
| 2012/0240995 A1 | 9/2012 | Coakley |
| 2012/0248497 A1 | 10/2012 | Zhou et al. |
| 2012/0279548 A1 | 11/2012 | Münch et al. |
| 2012/0318319 A1 | 12/2012 | Pinarbasi et al. |
| 2012/0325282 A1 | 12/2012 | Snow et al. |
| 2013/0065353 A1 | 3/2013 | Albrecht et al. |
| 2013/0096710 A1 | 4/2013 | Pinarbasi et al. |
| 2013/0139869 A1* | 6/2013 | Nuernberger ......... H02S 20/00 136/251 |
| 2013/0152996 A1 | 6/2013 | DeGroot et al. |
| 2013/0206221 A1 | 8/2013 | Gannon et al. |
| 2014/0124013 A1 | 5/2014 | Morad et al. |
| 2014/0124014 A1 | 5/2014 | Morad et al. |
| 2015/0004740 A1 | 1/2015 | Cho |
| 2015/0013596 A1 | 1/2015 | Matsumoto et al. |
| 2015/0090314 A1 | 4/2015 | Yang et al. |
| 2015/0144180 A1 | 5/2015 | Baccini et al. |
| 2015/0270410 A1 | 9/2015 | Heng et al. |
| 2015/0349145 A1 | 12/2015 | Morad et al. |
| 2015/0349153 A1 | 12/2015 | Morad et al. |
| 2015/0349161 A1 | 12/2015 | Morad et al. |
| 2015/0349162 A1 | 12/2015 | Morad et al. |
| 2015/0349167 A1 | 12/2015 | Morad et al. |
| 2015/0349168 A1 | 12/2015 | Morad et al. |
| 2015/0349169 A1 | 12/2015 | Morad et al. |
| 2015/0349170 A1 | 12/2015 | Morad et al. |
| 2015/0349171 A1 | 12/2015 | Morad et al. |
| 2015/0349172 A1 | 12/2015 | Morad et al. |
| 2015/0349173 A1 | 12/2015 | Morad et al. |
| 2015/0349174 A1 | 12/2015 | Morad et al. |
| 2015/0349175 A1 | 12/2015 | Morad et al. |
| 2015/0349176 A1 | 12/2015 | Morad et al. |
| 2015/0349190 A1 | 12/2015 | Morad et al. |
| 2015/0349193 A1 | 12/2015 | Morad et al. |
| 2015/0349701 A1 | 12/2015 | Morad et al. |
| 2015/0349702 A1 | 12/2015 | Morad et al. |
| 2015/0349703 A1 | 12/2015 | Morad et al. |

FOREIGN PATENT DOCUMENTS

| | | |
|---|---|---|
| DE | 102009044060 A1 | 3/2011 |
| EP | 2362430 A1 | 8/2011 |
| KR | 10 2012 0096322 A | 8/2012 |
| KR | 10 2013 0084516 A | 7/2013 |
| WO | 200089657 A1 | 7/2008 |
| WO | 2013020590 A1 | 2/2013 |
| WO | 2013/105750 A1 | 7/2013 |
| WO | 2014074826 A2 | 5/2014 |

OTHER PUBLICATIONS

International Search Report dated Mar. 31, 2016 for International Patent Application No. PCT/US2015/064137, 6 pages.
Written Opinion dated Mar. 31, 2016 for International Patent Application No. PCT/US2015/064137, 8 pages.

* cited by examiner

SYSTEMS AND METHOD FOR PRECISION AUTOMATED PLACEMENT OF BACKSHEET ON PV MODULES

CROSS-REFERENCE TO OTHER APPLICATIONS

This claims the benefit of U.S. Provisional Patent Application No. 62/088,509, entitled "SYSTEM, METHOD, AND APPARATUS FOR AUTOMATIC MANUFACTURING OF SOLAR PANELS," filed Dec. 5, 2014; and U.S. Provisional Patent Application No. 62/143,694, entitled "SYSTEMS AND METHODS FOR PRECISION AUTOMATION OF MANUFACTURING SOLAR PANELS," filed Apr. 6, 2015; the disclosures of which are incorporated herein by reference in their entirety.

This is also related to U.S. patent application Ser. No. 14/563,867, entitled "HIGH EFFICIENCY SOLAR PANEL," filed Dec. 8, 2014; and U.S. patent application Ser. No. 14/510,008, entitled "MODULE FABRICATION OF SOLAR CELLS WITH LOW RESISTIVITY ELECTRODES," filed Oct. 8, 2014; the disclosures of which are incorporated herein by reference in their entirety for all purposes.

FIELD OF THE INVENTION

This relates to photovoltaic (PV) module manufacturing, including assembly of a PV laminate.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of a strip may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a string.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND OF THE INVENTION

Advances in photovoltaic technology, which are used to make solar panels, have helped solar energy gain mass appeal among those wishing to reduce their carbon footprint and decrease their monthly energy costs. However, the panels are typically fabricated manually, which is a time-consuming and error-prone process that makes it costly to mass-produce reliable solar panels.

Solar panels typically include one or more strings of complete solar cells. Adjacent solar cells in a string may overlap one another in a cascading arrangement. For example, continuous strings of solar cells that form a solar panel are described in U.S. patent application Ser. No. 14/510,008, filed Oct. 8, 2014, and entitled "Module Fabrication of Solar Cells with Low Resistivity Electrodes," the disclosure of which is incorporated herein by reference in its entirety. Producing solar panels with a cascaded cell arrangement can reduce the resistance due to inter-connections between the strips, and can increase the number of solar cells that can fit into a solar panel.

A back sheet is used to form the roof-facing outer layer of the PV module. The back sheet is designed to protect the inner components of the module, specifically the photovoltaic cells and electrical components from external stresses as well as act as an electric insulator, and is typically a laminate of different types of polymer sheets/layers. Strips can be formed into a PV panel by bonding the strips onto a back sheet, and arranging a glass sheet over the strips to form a laminate. Framing and electrical wiring is then added to the laminate to form a complete PV panel. However, precise and consistent placement of strips onto back sheets and glass sheets can be difficult to be achieved reliably in high volumes if performed manually.

BRIEF SUMMARY OF THE INVENTION

Some embodiments of the invention are related to a method for constructing a photovoltaic (PV) substrate. In the method, a moving frame can be lowered towards a stack of back sheets and a back sheet of the stack of back sheets can be secured to the moving frame. The back sheet can then be transferred from the moving frame to the vacuum table. An adhesive can be dispensed to the back sheet using an adhesive dispenser. One or more strings can be placed onto the adhesive applied to the back sheet. The vacuum table can be rotated, and the back sheet can be released from the vacuum table onto a glass sheet.

In some embodiments, moving the moving frame can include operating a hoist coupled to the moving frame to lower the moving frame towards the stack of back sheets until the moving frame comes into contact or near contact with a back sheet.

In some embodiments, the hoist can be supported by a gantry bridge that is slidable between the stack of back sheets and a vacuum table.

In some embodiments, transferring the back sheet can include moving the gantry bridge to position the back sheet over the vacuum table.

In some embodiments, the adhesive dispenser can be attached to the gantry bridge and the gantry bridge can be configured to move while dispensing adhesive to apply an adhesive pattern onto the back sheet.

In some embodiments, placing a string onto the adhesive can include retrieving the at least one string from a staging location using an overhead string picking hoist coupled to a staging gantry.

In some embodiments, heaters can be positioned directly adjacent to the string on the back sheet and heating the at least one string using the heater to initiate curing of the adhesive.

In some embodiments, the string can be secured against the back sheet by applying a clamp against the at least one string.

In some embodiments, the clamp can include an airbag that is inflated against the at least one string.

In some embodiments, releasing the back sheet from the vacuum table can include dropping the back sheet onto the glass sheet.

Some embodiments are related to stem for constructing a photovoltaic (PV) substrate. A moving frame can be configured to pick and move the back sheets from a stack of back sheets. A vacuum table can be configured to receive the back sheet from the moving frame and apply suction to a back sheet. The vacuum table can be rotatable such that back sheet can face downward or upward while applying suction to hold the back sheet. The system can also include an adhesive dispenser for applying a pattern of adhesive to the back sheet when the back sheet is facing upward. A string picking hoist can be configured to retrieve at least one string and move the at least one string onto the pattern of adhesive. A glass sheet module can be positioned receive the back sheet, when the back sheet is facing downward, from the vacuum table after the at least one string is adhered to the back sheet.

In some embodiments, a hoist can be coupled to the moving frame, and the hoist can be configured to lower the moving frame towards the stack of back sheets until the moving frame comes into contact or near contact with the back sheet.

In some embodiments, the hoist can be supported by a gantry bridge that is slidable between the stack of back sheets and the vacuum table.

In some embodiments, the adhesive dispenser can be attached to the gantry bridge.

In some embodiments, the string picking hoist can be coupled to a staging gantry and can be configured to retrieve the at least one string from a staging location and move the at least one string from to the vacuum table by movement of the staging gantry.

In some embodiments, heaters can be attached to the moving frame, the heaters being configured to heat the at least one string using to initiate curing of the adhesive.

In some embodiments, a clamp can be operated to secure the at least one string against the back sheet during rotation of the vacuum table.

In some embodiments, the clamp can include air bags that are inflated to press the at least one string against the back sheet.

In some embodiments, the vacuum table can be configured to drop the back sheet and the at least one string onto a glass sheet positioned onto the glass sheet rack.

Some embodiments of the invention are related to a method for constructing a photovoltaic (PV) substrate. A hoist coupled to a moving frame can be operated to lower the moving frame towards a stack of back sheets until the moving frame comes into contact or near contact with a back sheet. The hoist can be supported by a gantry bridge that is slidable between the stack of back sheets and a vacuum table. Suction can be applied to the back sheet using the moving frame to secure the back sheet to the moving frame and remove the back sheet from the stack of back sheets. The gantry bridge can be moved to position the back sheet over the vacuum table. Suction can be applied to the back sheet using the vacuum table to transfer the back sheet from the moving frame to the vacuum table. An adhesive can be dispensed onto to the back sheet using an adhesive dispenser attached to the gantry bridge. At least one string can be retrieved from a staging location using an overhead string picking hoist coupled to a staging gantry. The at least one string can be moved from the staging location to the back sheet at the vacuum table. The at least one string can be lowered and released onto the adhesive applied to the back sheet. Heaters attached to the moving frame can be positioned directly adjacent to the at least one string on the back sheet, and the at least one string can be heated using the heater to initiate curing of the adhesive. The at least one string can be secured against the back sheet by applying a clamp against the at least one string. The vacuum table can be rotated 180 degrees such that the at least one string and back sheet face downward. The at least one string can be unsecured from the clamp. The back sheet can be released from the vacuum table onto a glass sheet such that the at least one string is between the back sheet and the glass sheet.

DETAILED DESCRIPTION OF THE INVENTION

Embodiments of the invention are generally related to systems and methods for assembling a PV laminate without manual interaction. Generally, the PV laminate includes at least a back sheet, at least one string bonded to the back sheet, and a glass sheet. The PV laminate can be used to assemble a PV module, which can additionally include a frame and additional electrical connections. Using an automated system, a back sheet can be placed and secured to a table to prevent any movement of the back sheet. The system then will bond one or more strings to the back sheet, and then place the back sheet and strings onto a glass sheet.

Figure 1:
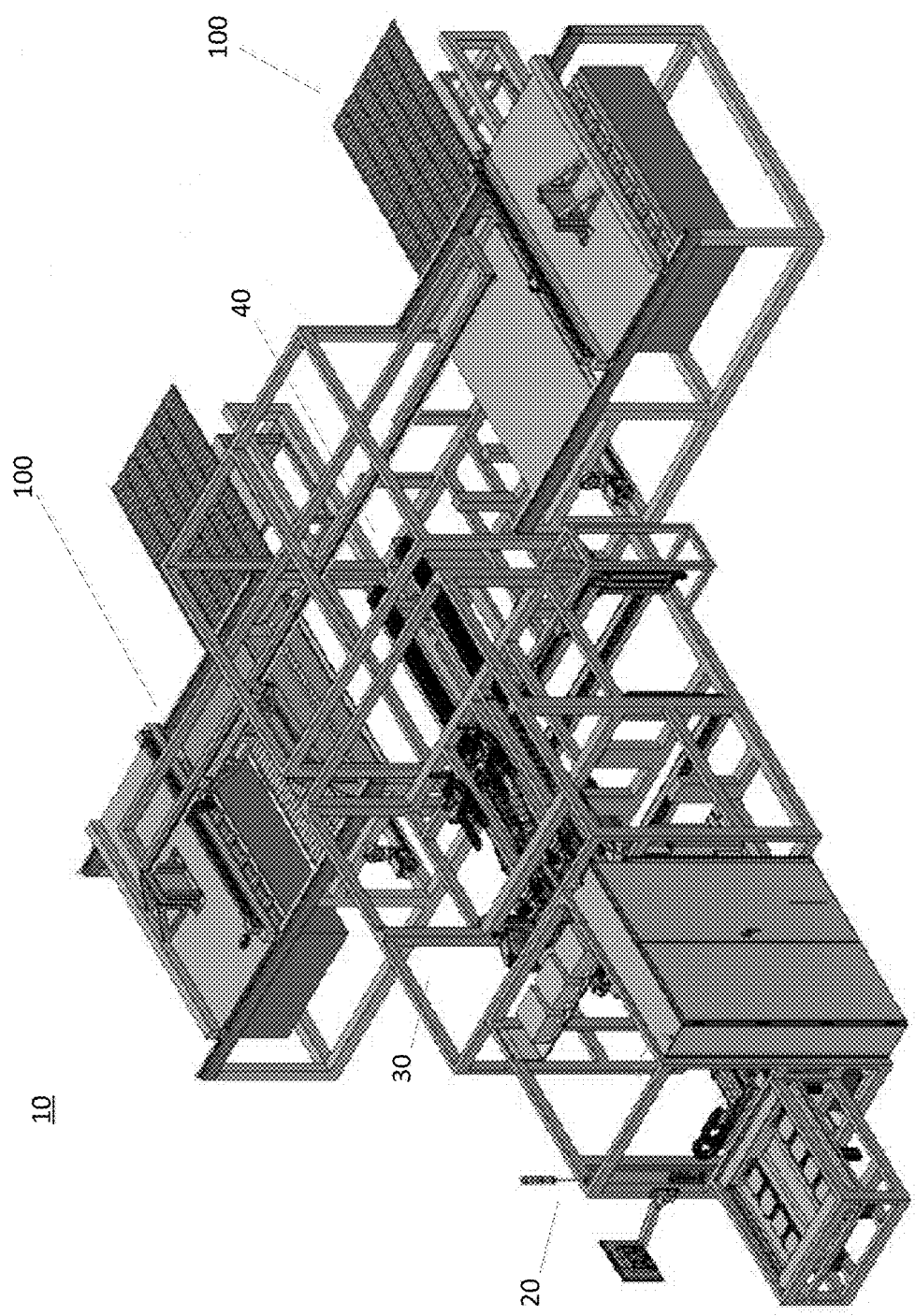
FIG. 1 shows a perspective view of a system for assembling aspects of a PV module, according to some embodiments of the invention.

FIG. 1 is a perspective view of a system 10 for producing a photovoltaic (PV) laminate, which can be used to manufacture a PV module. Intake module 20 receives cells, which are cut and reformed into strings using assembly module 30. Details of such modules are described in the above noted related applications, however, specific methods of string assembly are not critical to the instant disclosure, which is applicable to any type of string to form a PV laminate (i.e. an unframed PV module). Assembled strings are held at staging location 40 for further assembly into a PV laminate using PV laminating system 100. Here, two PV laminating systems 100 are shown, however, more or less can be used depending on desired throughput.

Figure 2:
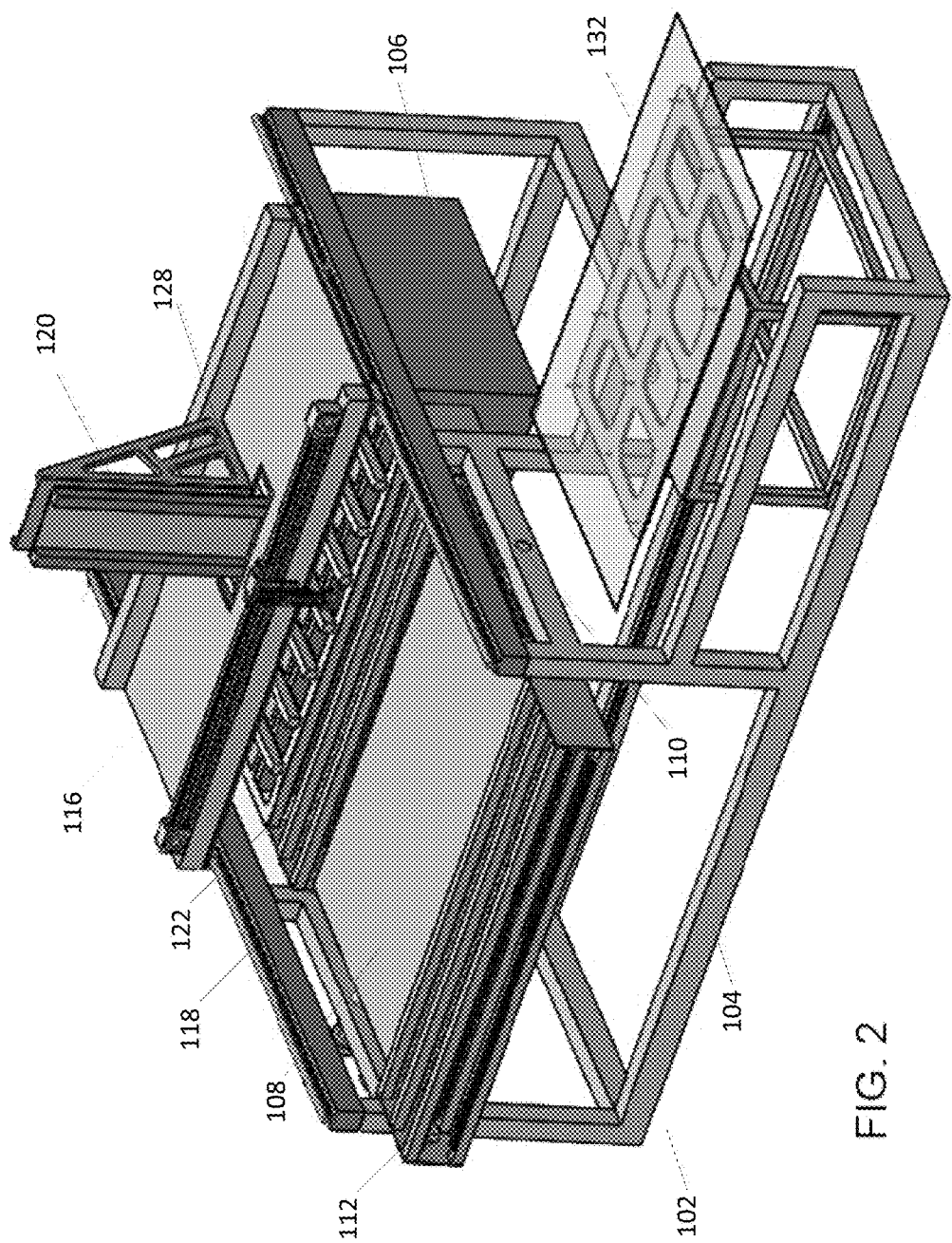
FIG. 2 shows a perspective view of a system for assembling PV laminate, according to some embodiments of the invention.

FIG. 2 shows a perspective view of PV laminating system 100, and FIGS. 3-6 show detailed aspects of system 100. The system 100 includes support frame 102, which forms the base for supporting various aspects of system 100. Support frame 102 can be bolted from elongated elements 104 (e.g. T-slot extrusions) for ease of configuration, however, other structures are possible, such as sheet metal construction or welded tubing.

Stacking module 106 holds a stack of back sheets, and here is formed as a boxed structure held by support frame 102. Many types of prefabricated back sheets are available for use with system 100, and custom back sheets can be used as well. The back sheet along with a sky-facing glass sheet, and one or more strings, forms a PV laminate that can be framed and wired into a finished PV module.

Adjacent to stacking module 106 is vacuum table 108, which is rotationally mounted to support frame 102 by axle 110. A motor 111 (not shown here, but depicted in FIG. 19) is belt coupled to axle 110 to rotate vacuum table 108. Vacuum table 108 can be sized to hold a single back sheet on both of its sides and includes a plurality of suction ports (not shown) coupled to a switchable suction source (not shown). In other embodiments, vacuum table 108 can hold a plurality of back sheets at each surface. Applying suction will cause the surface of a back sheet to hold fast against vacuum table 108 and thereby secure the back sheet in all possible rotations of vacuum table 108 about axle 110. Conversely, ceasing application of suction will unsecure the back sheet and release it if facing towards the ground.

Operation of vacuum table 108 can be accomplished by a computer controlled vacuum table operation module, which can be accompanied by a vision system (e.g., one or more cameras) that can capture images of back sheets and strings in association with vacuum table 108 and/or other aspects. A computer controller can run an image processing application to verify correct placement of vacuum table 108, and operate one or more electrical and/or mechanical components for controlling suction and position of vacuum table 108. Alternatively, a different type of sensor system can be used, such as one based on use of encoders, hall-effect sensors, etc.

Vacuum table 108 can include optional clamps 112 that are configured to slide over vacuum table 108 to additionally secure strings bonded to a back sheet during rotation. Clamps 112 are shown slid away from vacuum table at FIG. 2, and slid over vacuum table 108 at FIG. 5. Clamps 112 can be actuated by one or more actuators (not shown), such as a lead screw or belt driven by a computer controlled motor.

Clamps 112 can have a cage-like structure with a plurality of bars 112 arranged to envelope vacuum table 108. Bars 112 support inflatable air bags 114, and can include passage ways coupled to an air pump (not shown) for inflating air bags 114. Air bags 114 are inflated to press and hold a string against a back sheet secured to vacuum table 108, thereby securing the string during movement. After rotation of vacuum table 108, air bags 114 can be deflated and clamps 112 withdrawn. Alternatively, air bags 114 are not used, and the bars 112 are used to provide a non-contact safety net for a back sheet in case of a suction failure.

Operation of clamps 112 can be accomplished by a computer controlled clamps operation module, which can be accompanied by a vision system (e.g., one or more cameras) that can capture images of back sheets and strings in association with clamps 112 and/or other aspects. A computer controller can run an image processing application to verify correct placement of clamps 112, and move one or more electrical and/or mechanical components associated with clamps 112 accordingly. Alternatively, a different type of sensor system can be used, such as one based on use of encoders, hall-effect sensors, etc.

Gantry bridge 116 is depicted as a moveable platform spanning tracks 118 of support frame 102 for supporting various aspects of system 100. Gantry bridge 116 can be configured to slide on tracks 118 of support frame 102. This allows gantry bridge 116 to slide horizontally between ends of tracks 118.

Gantry bridge 116 can be actuated by one or more actuators (not shown), such as a lead screw or belt driven by a computer controlled motor. Operation of gantry bridge 116 can be accomplished by a computer controlled gantry bridge operation module, which can be accompanied by a vision system (e.g., one or more cameras) that can capture images of back sheets and strings in association with gantry bridge 116 and/or other aspects. A computer controller can run an image processing application to verify correct placement of gantry bridge 116, and move one or more electrical and/or mechanical components associated with gantry bridge 116 accordingly. Alternatively, a different type of sensor system can be used, such as one based on use of encoders, hall-effect sensors, etc.

Gantry bridge 116 supports hoist 120, which is shown here as a truss-like vertically extending frame having an actuation slide that provides vertical movement to moving frame 122. Hoist 120 can be actuated by one or more actuators (not shown), such as a lead screw or belt driven by a computer controlled motor. Operation of hoist 120 can be accomplished by a computer controlled hoist operation module, which can be accompanied by a vision system (e.g., one or more cameras) that can capture images of back sheets and strings in association with hoist 120 and/or other aspects. A computer controller can run an image processing application to verify correct placement of hoist 120, and move one or more electrical and/or mechanical components associated with hoist 120 accordingly. Alternatively, a different type of sensor system can be used, such as one based on use of encoders, hall-effect sensors, etc.

Figure 3:
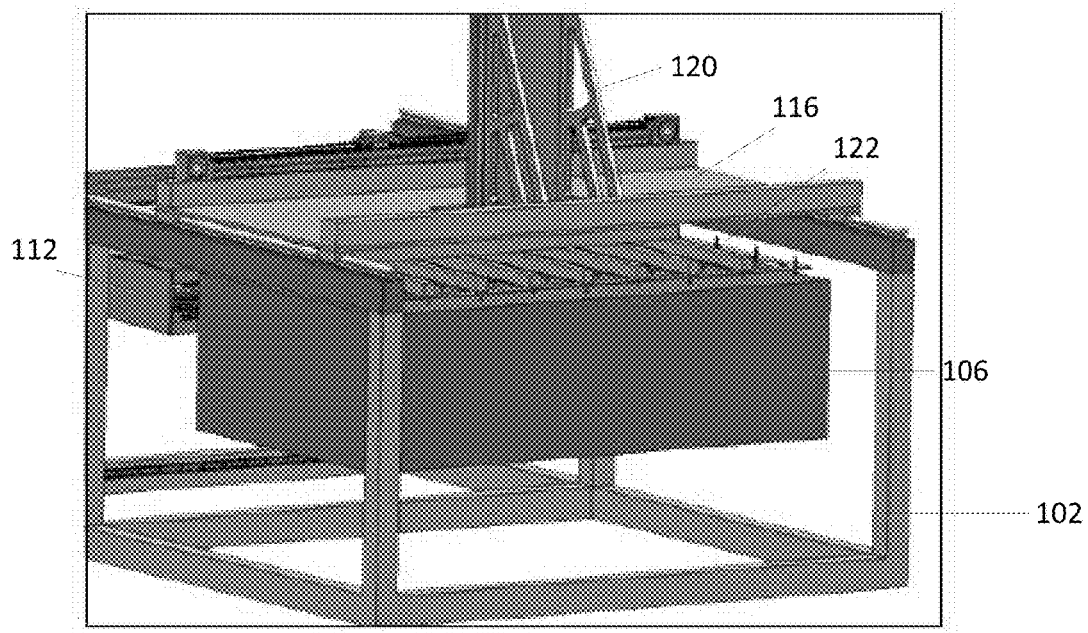
FIGS. 3-8 show aspects of a system for assembling PV laminate, according to some embodiments of the invention.
Figure 7:
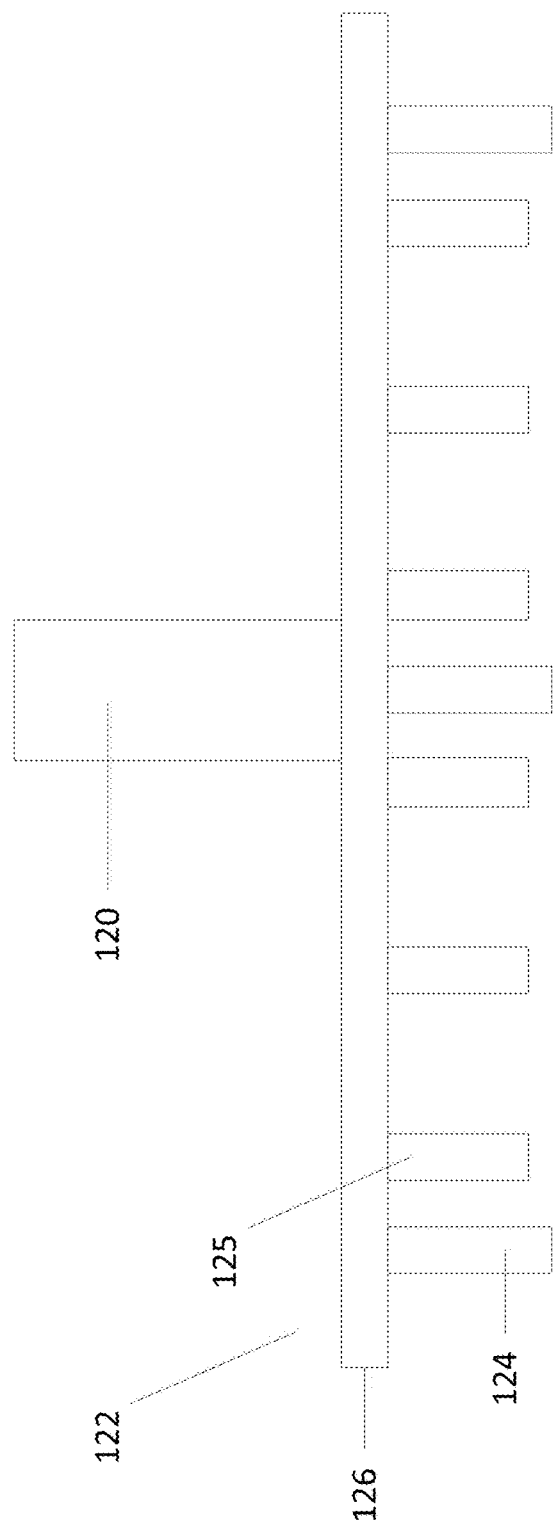

As shown at FIG. 3, moving frame 122 includes a plurality of suction members 124 supported by elongated frame elements 126, which can include suction lines connected to a suction source (not shown) for providing suction to the suction members 124. Suction members 124 are distributed throughout moving frame 122 such that when suction is applied when suction members 124 are contacting or in near contact (e.g. 1 mm) to stack of back sheets, the top-most back sheet will be held by suction members 124 until suction is discontinued. In addition, as shown at FIG. 7, moving frame can include one or more adhesion promotion devices 125, which are used to accelerate and/or initiate crosslinking of an adhesive. Examples of adhesion promotion devices 125 include heaters, UV lamps, air blowers, etc.

Operation of moving frame 122 can be accomplished by a computer controlled moving frame operation module, which can be accompanied by a vision system (e.g., one or more cameras) that can capture images of back sheets and strings in association with moving frame 122 and/or other aspects. A computer controller can run an image processing application to verify correct placement of moving frame 122, and operate one or more electrical and/or mechanical components for controlling suction and position of moving frame 122. Alternatively, a different type of sensor system can be used, such as one based on use of encoders, hall-effect sensors, etc.

Movement of hoist 120 away from stacking module 106 will lift the back sheet held by suction members 124 off of stacking module 106. Moving frame 122 can then be moved by movement of gantry bridge 116 along tracks 118 to position moving frame 122 and the back sheet held by suction members 124 over vacuum table 108. Once positioned, movement of hoist 120 towards vacuum table 108 causes moving frame 122 and the back sheet held by suction members 124 to be placed at or very near the surface of vacuum table 108. The vacuum ports of vacuum table 108 can apply a suction while suction of suction members 124 can be ceased, thereby transferring holding of the back sheet to vacuum table 108.

Figure 4:
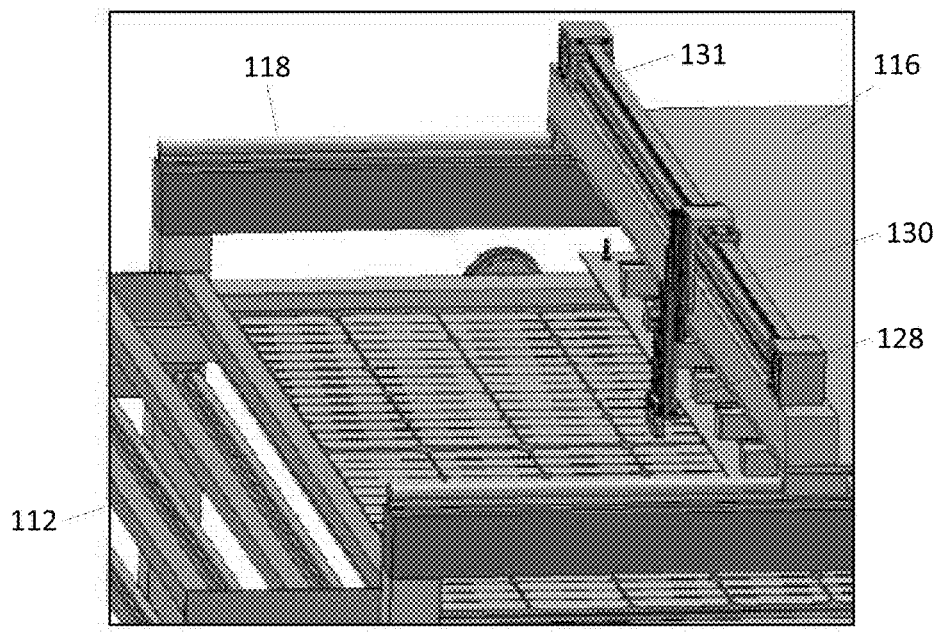
Figure 5:
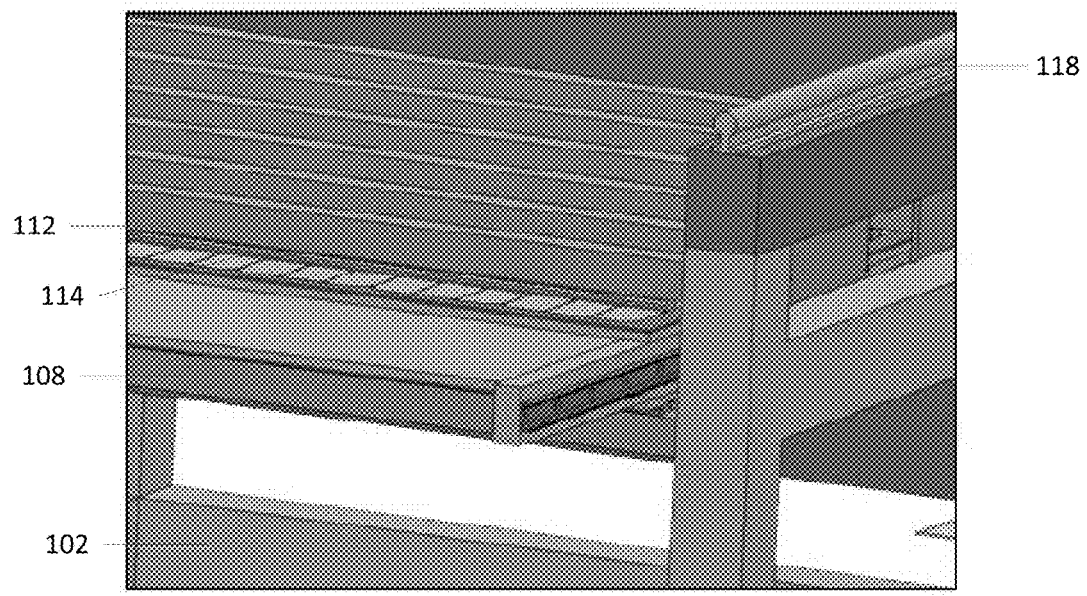
Figure 6:
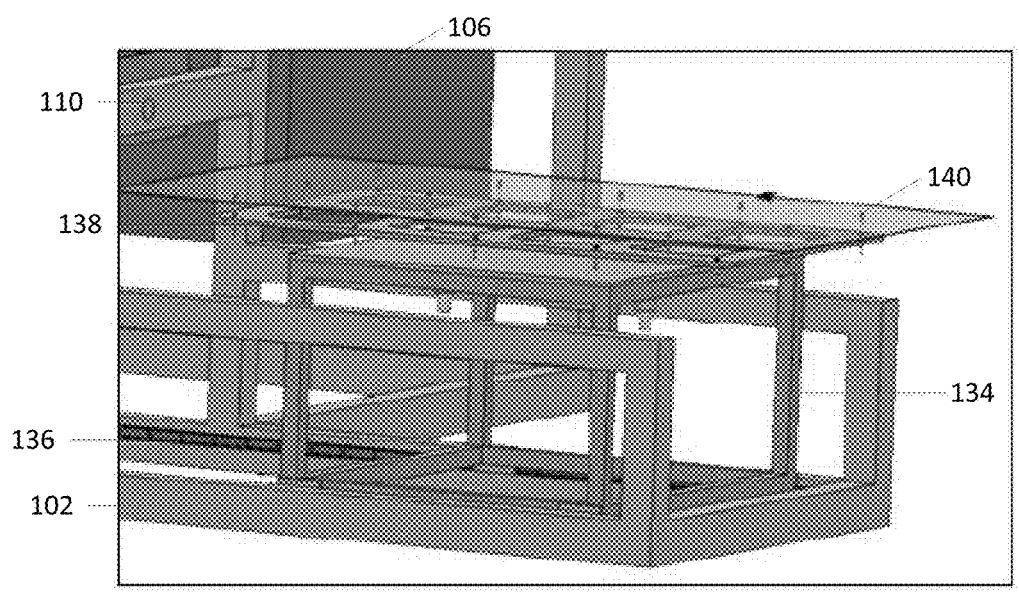

Gantry bridge 116 also supports adhesive dispenser 128. As shown at FIG. 4, adhesive dispenser 128 is mounted to vertical track 130, and can be actuated by an actuator (not shown) such as a lead screw or belt driven by a motor to provide vertical movement (Z movement). Vertical track 130 is mounted to horizontal track 131, which can be actuated by an actuator (not shown) such as a lead screw or belt driven by a motor to provide horizontal movement (X movement) to adhesive dispenser 128. Movement by gantry bridge 116 along tracks 118 provides secondary horizontal movement (Y movement) that is perpendicular to the horizontal movement of horizontal track 131. Accordingly, use of these elements provides three axis orthogonal movement for adhesive dispenser 128. Adhesive dispenser 128 can dispense adhesive by way of a motor controlled pump or pressurized dispensing system.

Operation of dispenser 128 can be accomplished by a computer controlled dispenser operation module, which can be accompanied by a vision system (e.g., one or more cameras) that can capture images of back sheets and strings in association with dispenser 128 and/or other aspects, such as a pattern of adhesive. A computer controller can run an image processing application to verify correct placement of dispenser 128, and move one or more electrical and/or mechanical components associated with dispenser 128 to dispense a pattern of adhesive onto a string. Alternatively, a different type of sensor system can be used, such as one based on use of encoders, hall-effect sensors, etc.

Glass sheet module 132 is disposed laterally from vacuum table 108. Glass sheet module 132 includes a moveable frame 134, which is supported by tracks 136 mounted to support frame 102. Glass sheet module 132 can be actuated by linear actuator (not shown) such as a lead screw or belt driven by a motor to provide vertical movement along tracks 136. Moveable frame 134 supports glass sheet tray 138 that includes a plurality of suction members 142. Glass sheet tray 138 can include suction lines connected to a suction source (not shown) for providing suction to suction members 142. Suction members 142 are distributed throughout glass sheet tray 138 such that when suction is applied a glass sheet will be held by suction members 142 until suction is discontinued.

Operation of glass sheet module 132 can be accomplished by a computer controlled glass sheet module operation module, which can be accompanied by a vision system (e.g., one or more cameras) that can capture images of glass sheets in association with glass sheet module 132 and/or other aspects. A computer controller can run an image processing application to verify correct placement of glass sheet module 132, and operate one or more electrical and/or mechanical components for controlling suction and position of glass sheet module 132. Alternatively, a different type of sensor system can be used, such as one based on use of encoders, hall-effect sensors, etc.

Glass sheet module 132 can be actuated to position glass sheet tray 138 underneath vacuum table 108 and receive a floor facing back sheet and adhered strings, which are released from vacuum table 108 onto a glass sheet held by glass sheet module 132. The back sheet, stings, and glass sheet form a PV laminate that can be framed and wired into a PV module.

Figure 8:
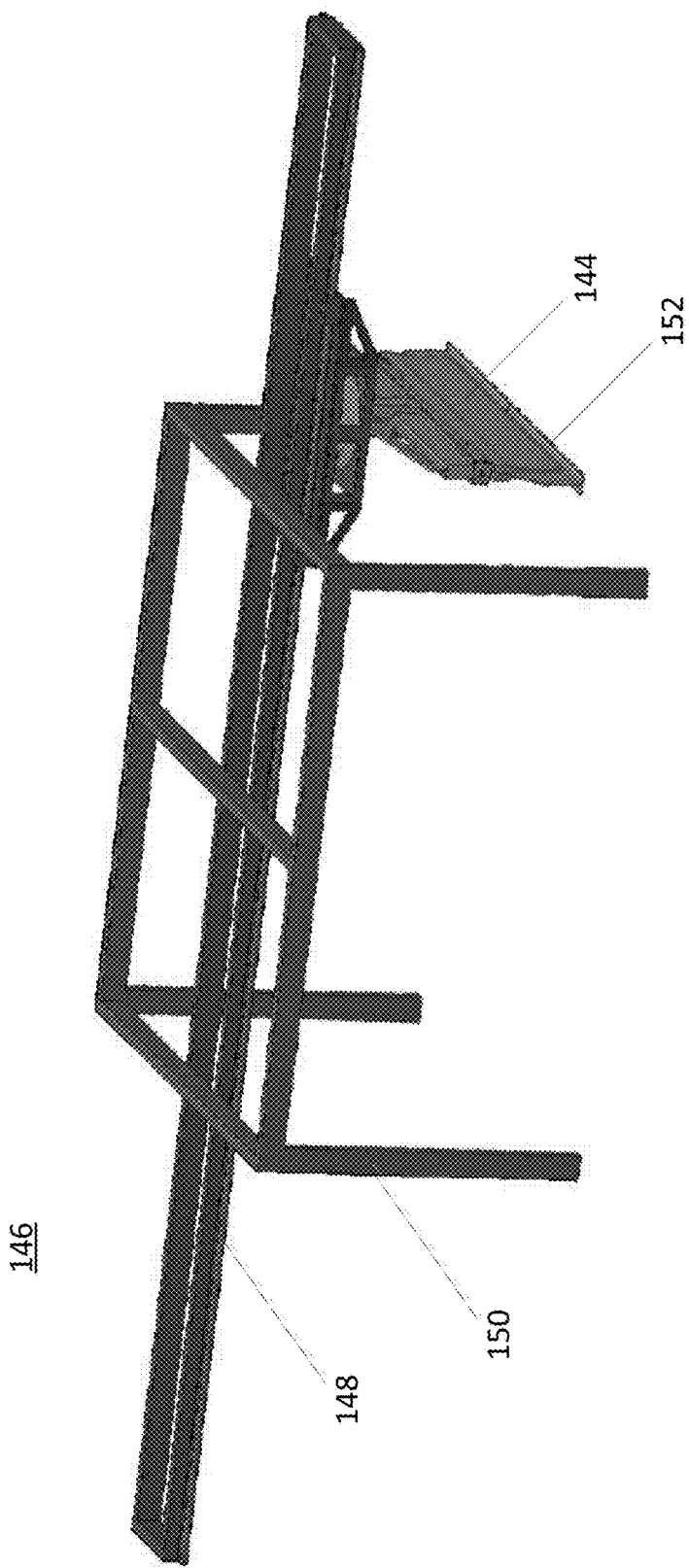
Figure 13:
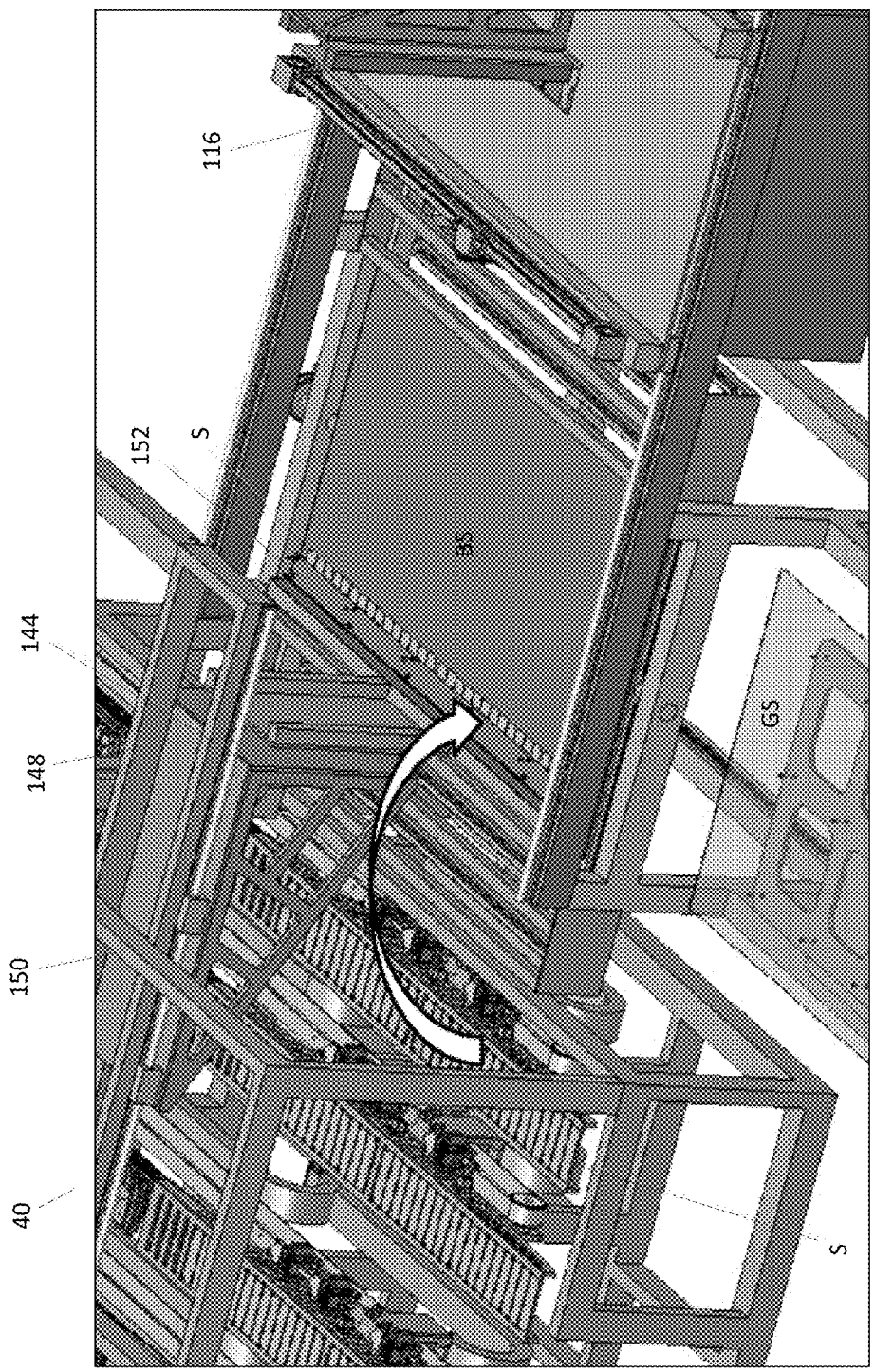

As shown at FIG. 8, string picking hoist 144 is configured deliver strings adjacent to vacuum table 108 via an overhead mounted staging gantry 146. Staging gantry 146 includes an elongated track 148 supported by gantry frame 150. String picking hoist 144 travels along elongated track 148, and can be actuated by an actuator (not shown) such as a lead screw or belt driven by a motor. String picking hoist 144 can include an additional actuator (not shown) such as a lead screw or belt driven by a motor to provide vertical movement. String picking hoist 144 can include grabbing portion 152 coupled to a vacuum source for picking up strings. Suction members are distributed throughout grabbing portion 152 such that when suction is applied a string will be held by grabbing portion 152 until suction is discontinued. String picking hoist 144 shown here features a symmetrical arrangement for moving strings between more than one PV assembly system 100, as shown at FIG. 1. However, a non-symmetrical arrangement can also be used, such as shown at FIG. 13 for use with a singular PV assembly system 100 or a plurality of PV assembly systems 100 arranged on one side of system 10.

Operation of string picking hoist 144 can be accomplished by a computer controlled string picking hoist operation module, which can be accompanied by a vision system (e.g., one or more cameras) that can capture images of glass sheets in association with string picking hoist 144 and/or other aspects. A computer controller can run an image processing application to verify correct placement of string picking hoist 144, and operate one or more electrical and/or mechanical components for controlling suction and position of string picking hoist 144. Alternatively, a different type of sensor system can be used, such as one based on use of encoders, hall-effect sensors, etc.

Figure 9:
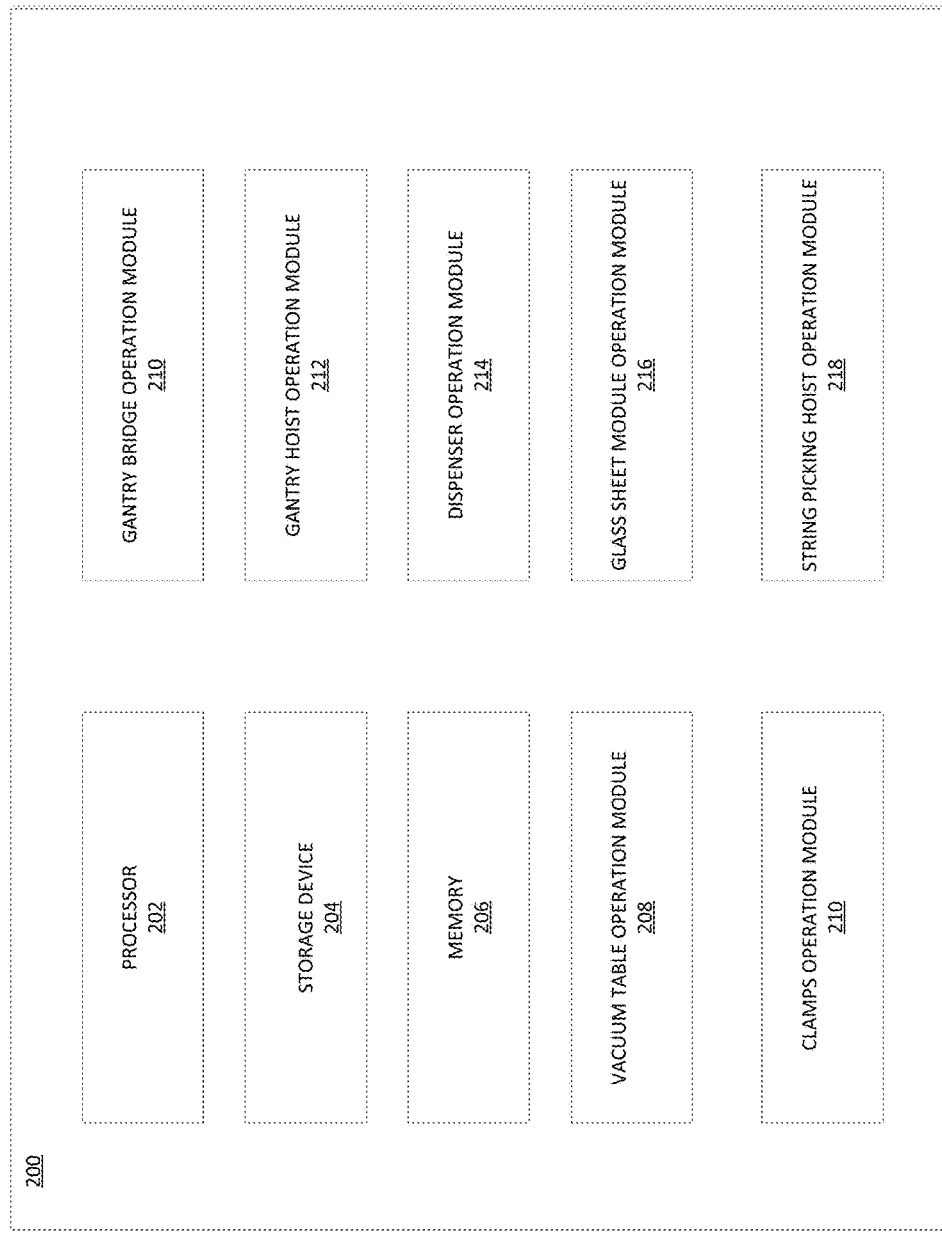
FIG. 9 shows a diagram of a control system for assembling PV laminate, according to some embodiments of the invention.

FIG. 9 shows control system 200 that can facilitate assembly of a PV substrate. Control system 200 can include a plurality of modules which may communicate with one another via a wired or wireless communication channel. Control system 200 may be realized using one or more integrated circuits, and may include fewer or more modules than those shown in FIG. 9. Further, control system 200 may be integrated in a computer system, or realized as a separate device which is capable of communicating with other computer systems and/or devices, such as the devices of systems 10 and more specifically, devices of PV assembly system 100.

Control system 200 can include processor 202, storage device 204, and memory 206. Memory 206 can include a volatile memory (e.g., RAM) that serves as a managed memory, and can be used to store one or more memory pools. In some embodiments, storage device 206 can store an operating system, and instructions for monitoring and controlling the assembly of a PV substrate, such as the methods or portions of methods depicted at FIG. 10, and at FIGS. 11-20.

Control system 200 can include vacuum table operation module 208, which controls operation of one or more devices associated with a vacuum table, which can be vacuum table 108 for example. Such devices, for example, can include vacuum solenoids and actuation motors. For example, vacuum table operation module 208 can operate solenoids to apply suction to a vacuum table to hold a back sheet to the vacuum table, and/or operate a motor to rotate the back sheet about an axis. Vacuum table operation module 208 can be accompanied by a vision system (e.g., one or more cameras) that can capture images of back sheets and strings in association with the vacuum table and/or other aspects. However, other types of sensor systems can be used in conjunction with vacuum table operation module 208.

Control system 200 can also include clamps operation module 210, which controls operation one or more devices associated with a clamp in association with a vacuum table, which can be clamp 112 for example. Such devices, for example, can include solenoids for pressurizing air bags and motors for actuating the clamps. For example, clamps operation module 210 can operate one or more motors to control position of the clamps with respect to a vacuum table and/or operate pressurization solenoids to pressurize (and depressurize) air bags for holding strings against a back sheet. Clamps operation module 208 can be accompanied by a vision system (e.g., one or more cameras) that can capture images of back sheets and strings in association with the clamps and/or other aspects. However, other types of sensor systems can be used in conjunction with clamps operation module 208.

Control system 200 can also include gantry bridge operation module 210, which controls operation one or more devices associated with a gantry bridge, which can be gantry bridge 116 for example. Such devices, for example, can include one or more motors for actuating aspects of the gantry bridge. For example, gantry bridge operation module 210 can control one or more motors associated with positioning of the gantry bride along a track. Gantry bridge module 210 can be accompanied by a vision system (e.g., one or more cameras) that can capture images of back sheets and strings in association with the gantry bridge and/or other aspects. However, other types of sensor systems can be used in conjunction with gantry bridge operation module 210.

Control system 200 can also include gantry hoist operation module 212, which controls operation one or more devices associated with a gantry hoist, which can be hoist 120 in association with lifting table 122 for example. Such devices, for example, can include solenoids for applying suction to back sheets and motors for actuating aspects of the hoist. For example, gantry hoist operation module 212 can operate solenoids for applying suction to a back sheet using a lifting table and/or operating a motor associated with vertical positioning of the lifting table. Gantry hoist operation module 212 can be accompanied by a vision system (e.g., one or more cameras) that can capture images of back sheets and strings in association with the gantry hoist and/or other aspects. However, other types of sensor systems can be used in conjunction with gantry hoist operation module 212.

Control system 200 can also include dispenser operation module 214, which controls operation of one or more devices associated with an adhesive dispenser, which can be dispenser 128 for example. Such devices, for example, can include solenoids and/or motors for applying adhesive to back sheets and/or motors for actuating position of the adhesive dispenser. For example, dispenser operation module 214 can operate one or more motors for X, Y, and Z positioning of a dispenser with respect to a back sheet and one more motor/solenoids for controlling dispensing of an adhesive by the dispenser. Dispenser operation module 214 can be accompanied by a vision system (e.g., one or more cameras) that can capture images of back sheets and strings in association with the dispenser, adhesive pattern, and/or other aspects. However, other types of sensor systems can be used in conjunction with gantry hoist operation module 214.

Control system 200 can also include glass sheet module operation module 216, which controls operation of one or more devices associated with a glass sheet module, which can be glass sheet module 132 for example. Such devices, for example, can include solenoids for applying suction to glass sheets and motors for actuating aspects of the glass sheet module. For example, glass sheet module operation module 216 can operate one or more motors for positioning a glass sheet tray and one more solenoids for controlling suction applied by the glass sheet tray to securely hold a glass sheet. Glass sheet module operation module 216 can be accompanied by a vision system (e.g., one or more cameras) that can capture images of glass sheets in association with the glass sheet tray and/or other aspects. However, other types of sensor systems can be used in conjunction with glass sheet module operation module 216.

Control system 200 can also include string picking hoist operation module 218, which controls operation of one or more devices associated with a string picking hoist, which can be string picking hoist 144 for example. Such devices, for example, can include solenoids for applying suction to strings and motors for actuating aspects of the string picking hoist. For example, string picking hoist operation module 218 can operate one or more motors for vertically and linearly positioning a string picking hoist and one more solenoids for controlling suction applied by a grabbing portion of the stringing picking hoist to securely hold a string. String picking hoist operation module 218 can be accompanied by a vision system (e.g., one or more cameras) that can capture images of strings in association with the string picking hoist and/or other aspects. However, other types of sensor systems can be used in conjunction with glass sheet module operation module 216.

Figure 10:
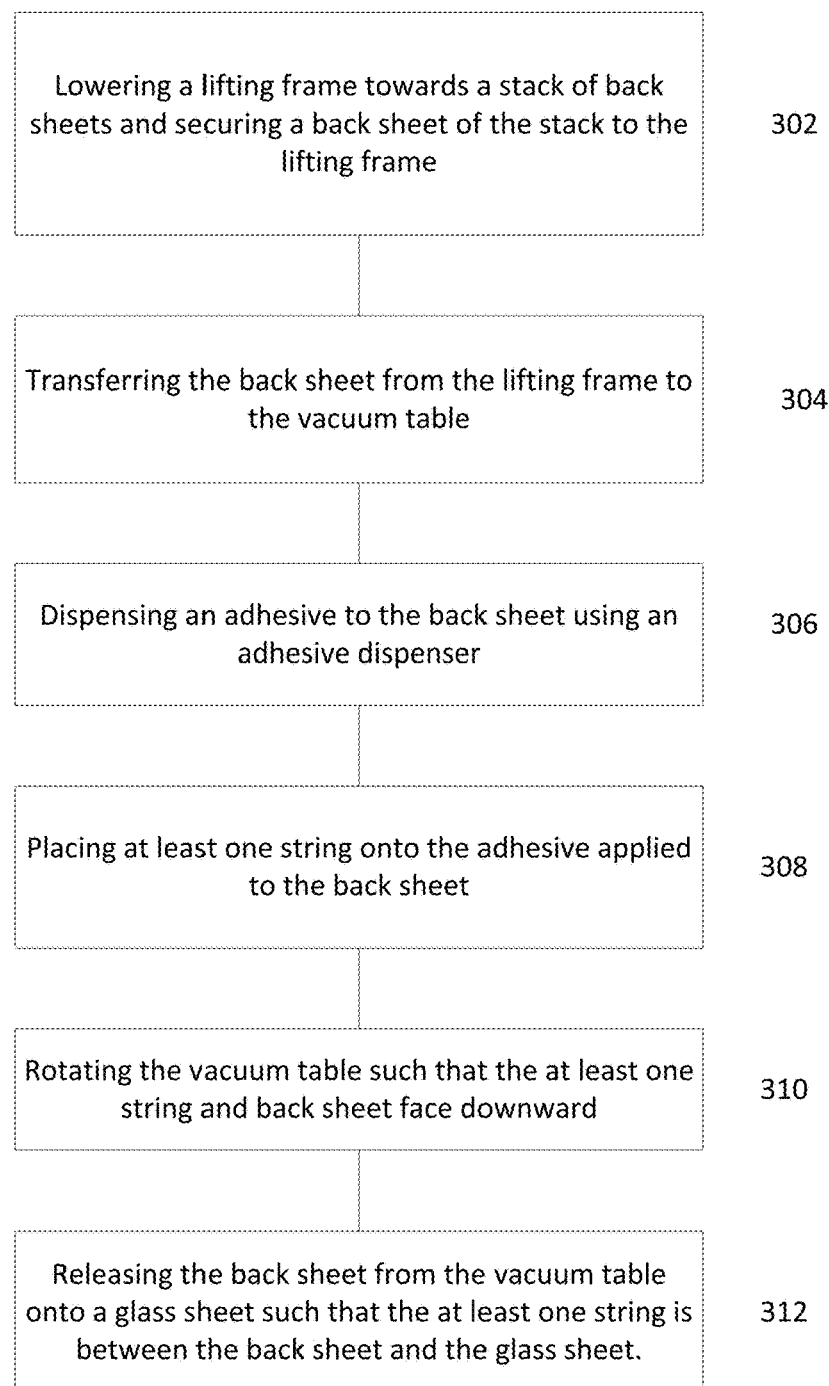
FIG. 10 shows a flow diagram of a method for assembling PV laminate, according to some embodiments of the invention.

FIG. 10 depicts a flow chart depicting method 300 for assembling a PV substrate, according to some embodiments of the invention. Method 300 can be used in conjunction with aspects of system 10, or more specifically PV assembly system 100, and be implemented, for example, by control system 200.

At operation 302, a moving frame is lowered towards a stack of back sheets and a back sheet is secured to the moving frame. Operation 302 can be accomplished for example, by operating a hoist coupled to a moving frame to lower the moving frame towards a stack of back sheets until the moving frame comes into contact or near contact with a back sheet. The hoist can be supported by a gantry bridge that is slidable between the stack of back sheets and a vacuum table. Suction can be applied to the back sheet using the moving frame to secure the back sheet to the moving frame and remove the back sheet from the stack of back sheets.

At operation 304, the back sheet is transferred from the moving frame to the vacuum table. This can be accomplished by moving the gantry bridge to position the back sheet over the vacuum table. Suction is then applied to the back sheet using the vacuum table to transfer the back sheet from the moving frame to the vacuum table.

Figure 11:
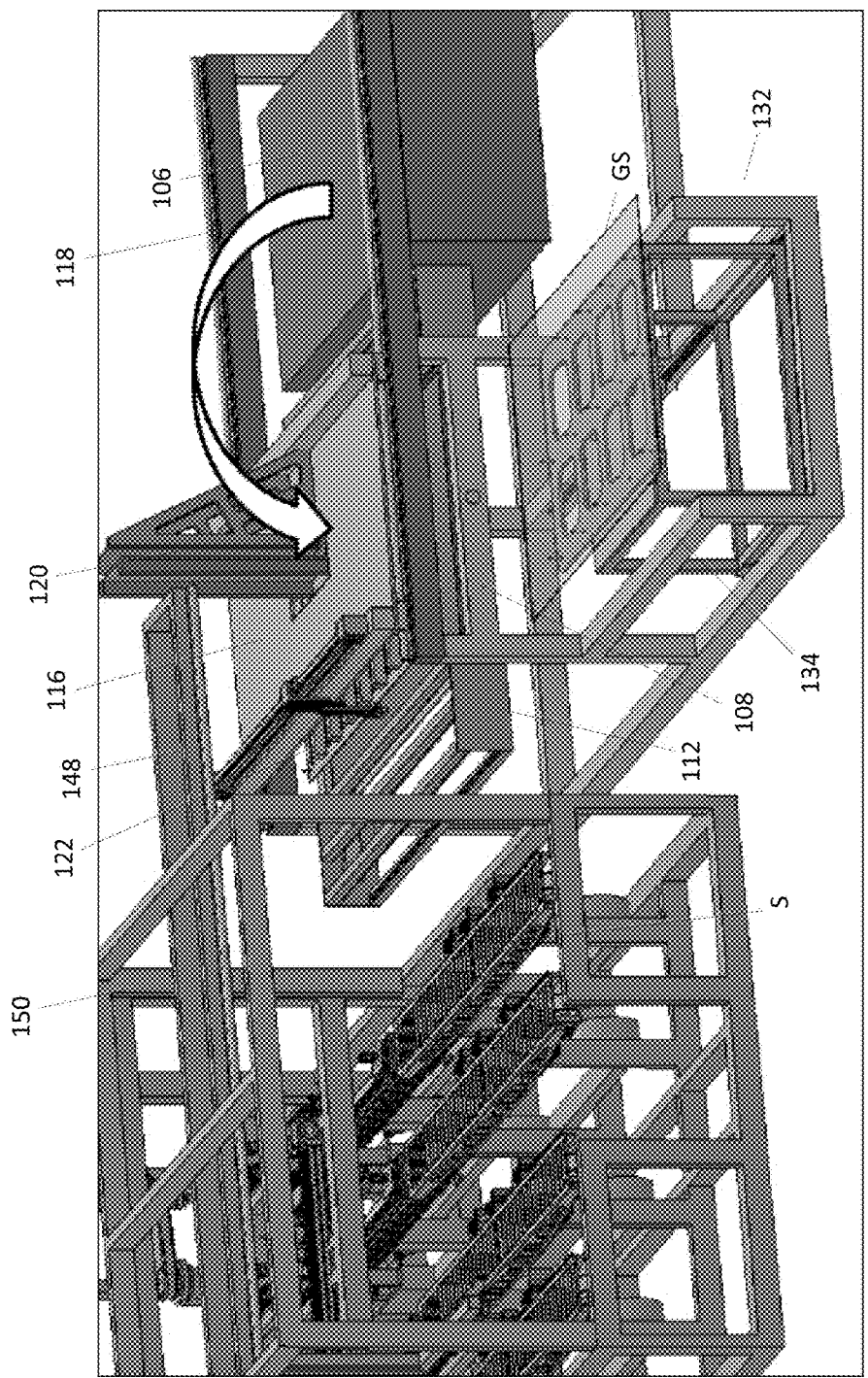
FIGS. 11-20 show perspective views of steps for assembling PV laminate, according to some embodiments of the invention.

Examples of operations 302 and 304 are depicted at FIG. 11. Here, gantry bridge 116 can be positioned over stacking module 106. Hoist 120 is then operated to lower moving frame 122, until moving frame 122 comes into contact or near contact (e.g. a 1 mm separation) between suction members 124 and top-most back sheet BS of stacking module 106. Suction is then applied by suction members 124 to hold back sheet BS and enable separation of back sheet BS from stacking module 106. Hoist 120 is then operated to lift back sheet BS a requisite distance away from stacking module 106. Gantry bridge 116 is then operated to move gantry bridge 116 along tracks 118 until back sheet BS is positioned over vacuum table 108. Depending on the distance between back sheet BS and vacuum table 108, hoist 120 can be operated to lower back sheet BS until back sheet BS is in contact or near contact (e.g. a 1 mm separation) with vacuum table 108. Vacuum table 108 is then operated to apply suction against back sheet BS before or after suction applied to back sheet BS by suction members 124 of moving frame 122 is ceased. Accordingly, back sheet BS is then secured to vacuum table 108 by the applied suction.

With reference back to FIG. 10, at operation 306, an adhesive is dispensed to the back sheet using an adhesive dispenser. This can be accomplished, for example by moving an adhesive dispenser attached to the gantry bridge over the back sheet BS and simultaneously dispensing adhesive according to a desired dispersal pattern.

Figure 12:
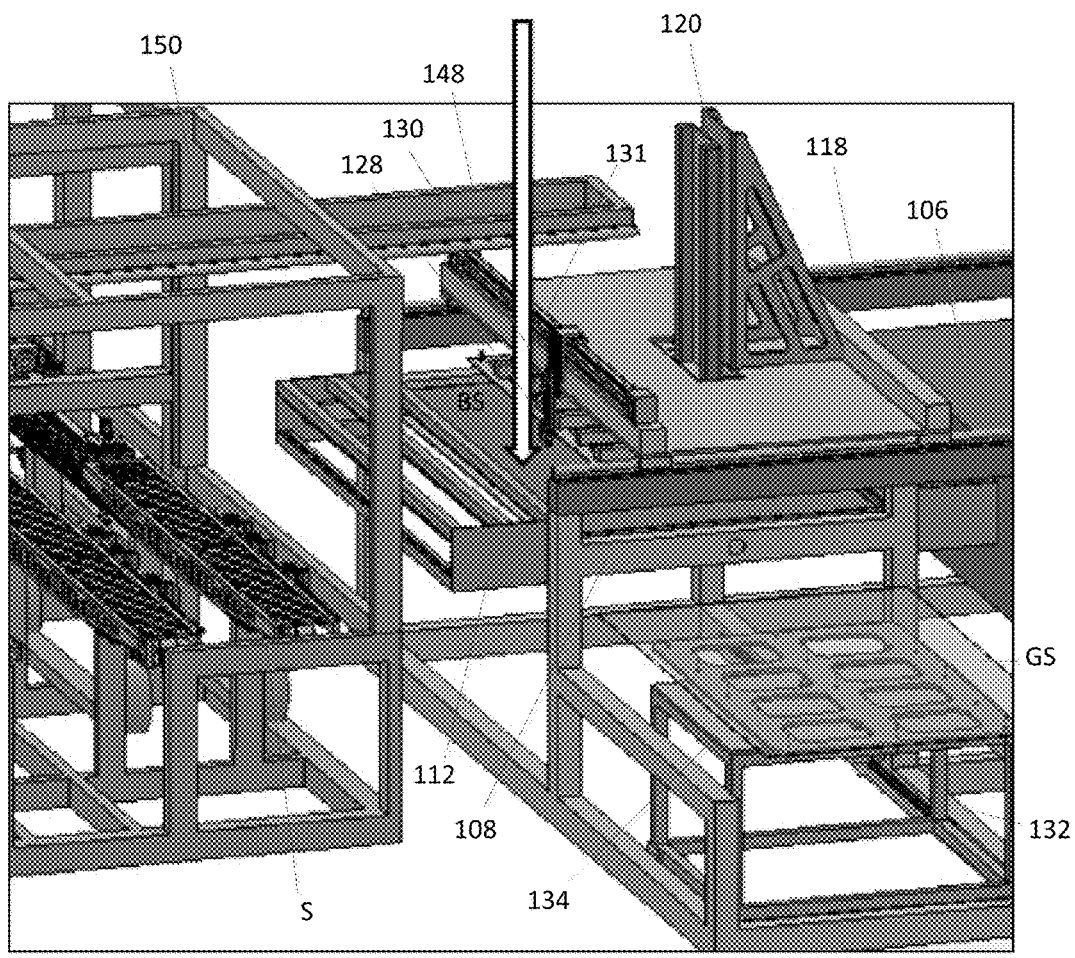

An example of operation 306 is depicted at FIG. 12. Here, dispenser 128 is operated along vertical track 130 and horizontal track 131, in addition gantry bridge 116 is operated along track 118 to provide X, Y, and Z movement with respect to back sheet BS. One or more motors and/or solenoids associated with dispensing adhesive from dispenser 128 are operated simultaneously to provide an adhesive pattern for securing at least one string. Depending on the availability of strings and curing requirements of the adhesive used, a pattern for a plurality of strings can be applied over the entirety of back sheet BS, or adhesive for only one string can be applied. In case of the latter, successive patterns can be applied after a string is placed onto a prior applied adhesive pattern to iteratively apply patterns of adhesive and strings on an as-needed basis.

With reference back to FIG. 10, at operation 308, at least one string is applied onto the adhesive to the back sheet. Operation 308 can be accomplished, for example, by retrieving at least one string from a staging location using an overhead string picking hoist coupled to a staging gantry. The at least one string can be moved from the staging location to the back sheet at the vacuum table. The at least one string can then be lowered and released onto the adhesive previously applied to the back sheet.

An example of operation 308 is depicted at FIG. 13. Here, string picking hoist 144 is moved along elongated track 148 to position grabbing portion 152 over string S located at staging location 40. Grabbing portion 152 is then lowered over the string S at staging location 40 until grabbing portion 152 comes into contact or near contact with string S. Suction is then applied by grabbing portion 152 to secure string S held at staging location 40 against grabbing portion 152. String picking hoist 144 is then operated to lift grabbing portion 152 and string S vertically away from staging location 40, and then string picking hoist 144 is moved along elongated track 148 until string S is positioned directly over a previously applied adhesive pattern. String picking hoist is then operated to lower the string S until string S comes into contact or near contact with the adhesive pattern. In some embodiments, string picking host 144 operated to hold string S against the adhesive pattern with a certain amount of pressure. Suction is then discontinued by grabbing portion 152 to release string S from grabbing portion 152 and transfer sting S to back sheet BS. This process can be repeated until the entirety of back sheet BS is covered with a desired amount of back sheets.

Figure 14:
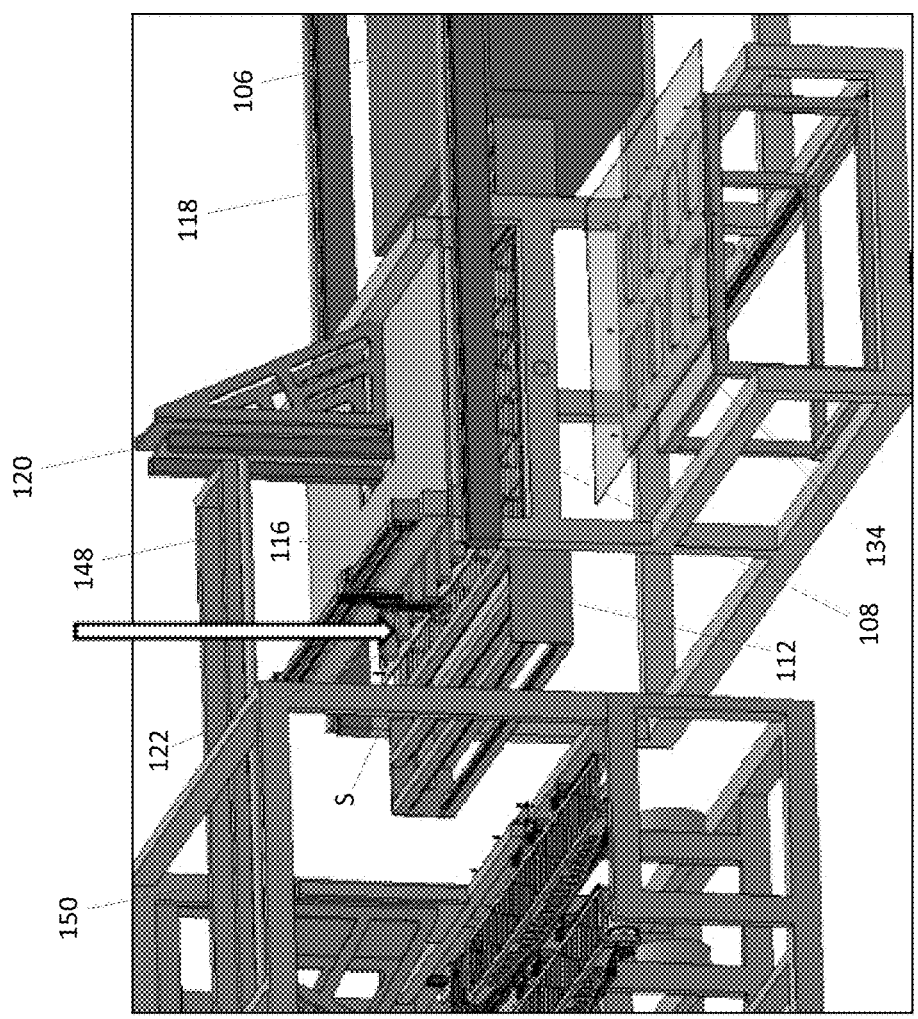

In some embodiments, after at least one string S is applied to back sheet BS, heaters, or some other type of adhesive promotor (e.g. UV lamps, air blowers, etc.) attached to the moving frame 122 can be positioned directly adjacent to string S to promote crosslinking of the adhesive applied between string S and back sheet BS. An example of this is shown at FIG. 14. Here, gantry bridge 116 is positioned directly over back sheet BS and string(s) S, and optionally lowered such that adhesion promotion devices 125 of moving frame 122 are placed at a desired location with respect to back sheet BS and string(s) S. Adhesion promotion devices 125 are then operated for to promote crosslinking of the adhesive located between back sheet BS and string(s) S, which can be, for example, heating the at least one string S using a heater to initiate curing of the adhesive. After a certain amount of time, operation of adhesion promotion devices 125 is halted and the bridge 116 is positioned away from vacuum table 108, for example, to over stacking module 106. At this time, operation 302 can optionally be performed again to ready a second back sheet.

With reference back to FIG. 10, at operation 310, the vacuum table is rotated such that the at least one string and back sheet face downward. Operation 310 can be performed by securing the at least one string against the back sheet by applying a clamp against the at least one string, and then rotating the vacuum table 180 degrees such that the at least one string and back sheet face downward. The at least one string can then be unsecured from the clamp.

Figure 15:
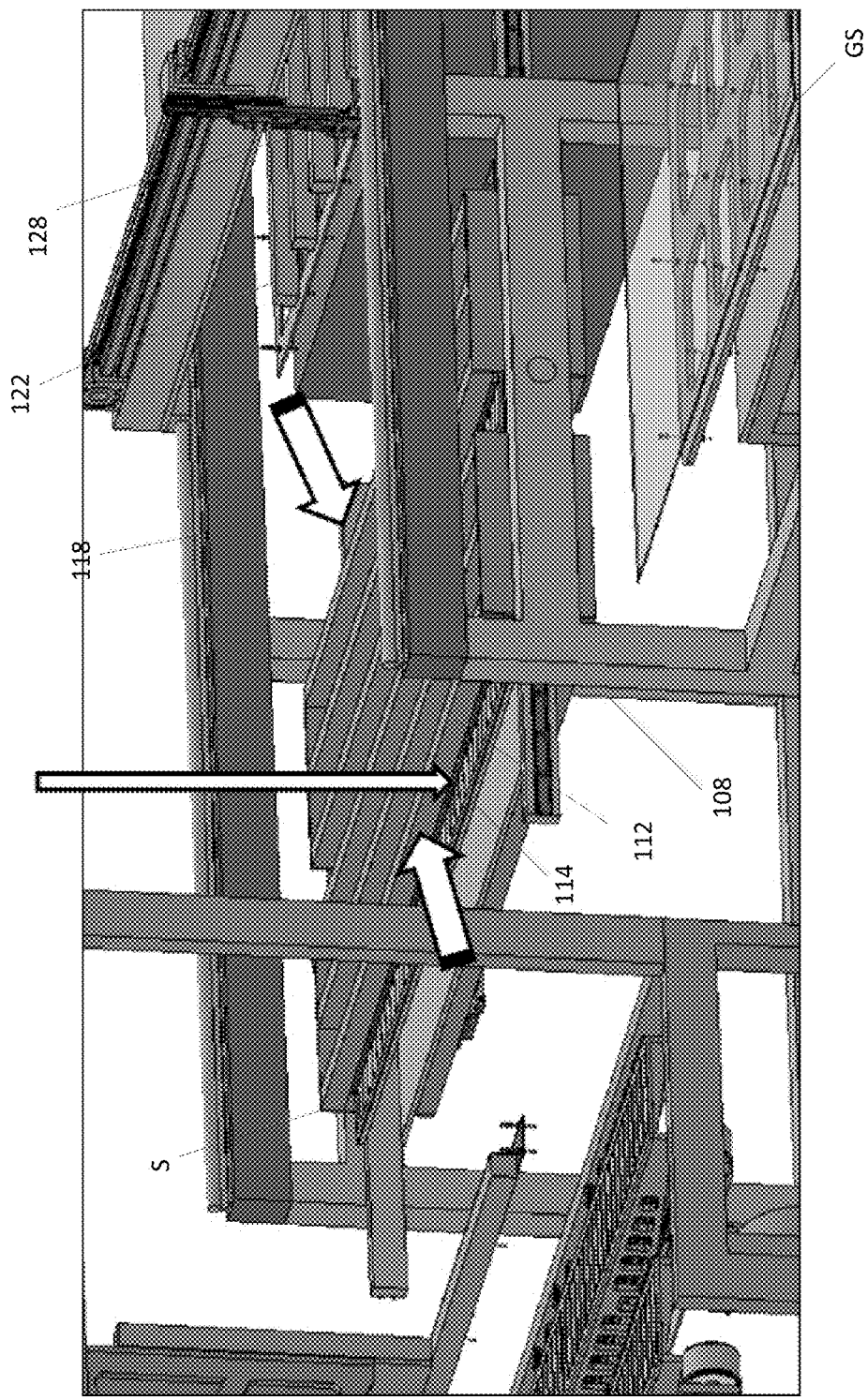
Figure 16:
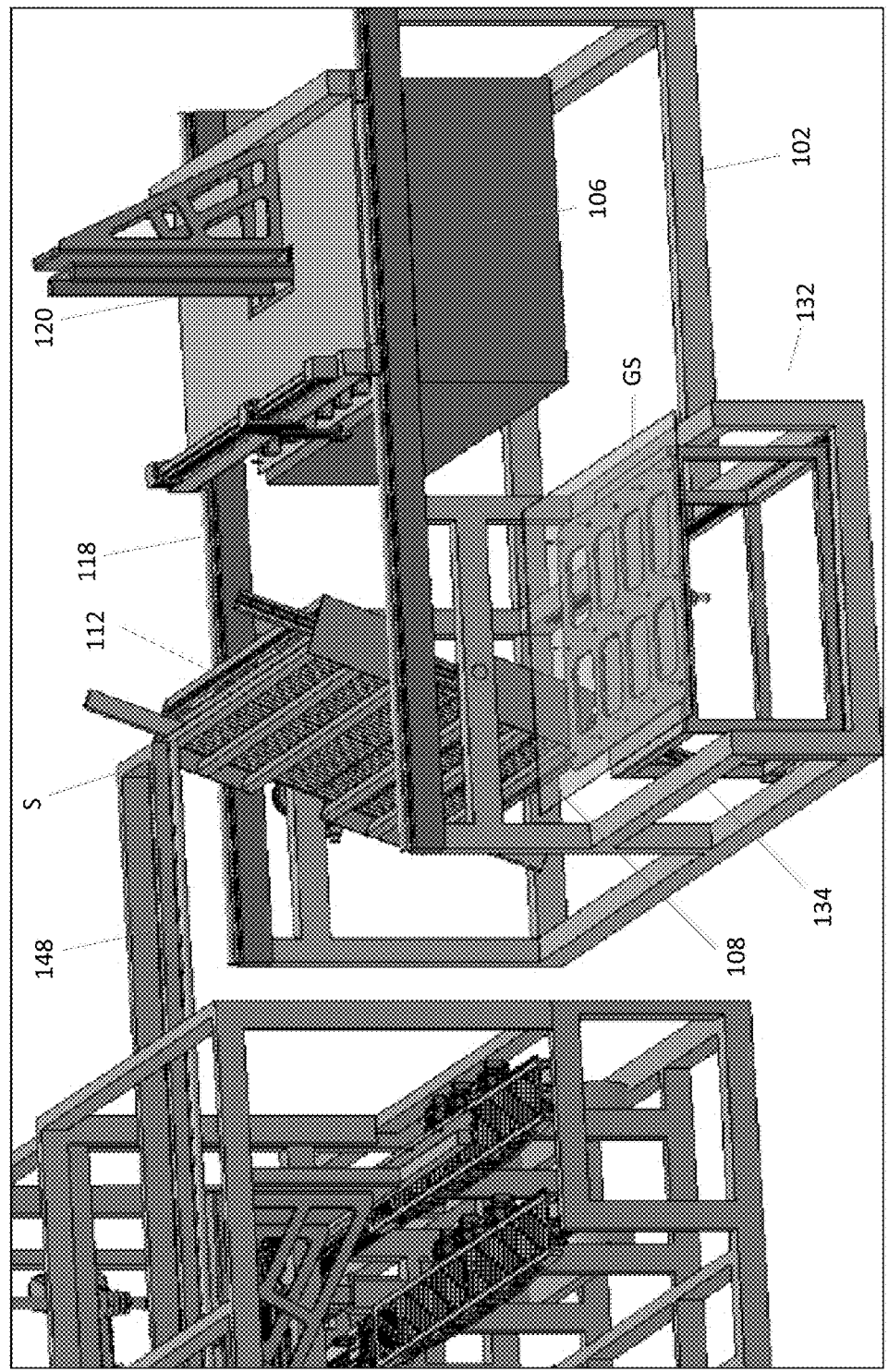
Figure 17:
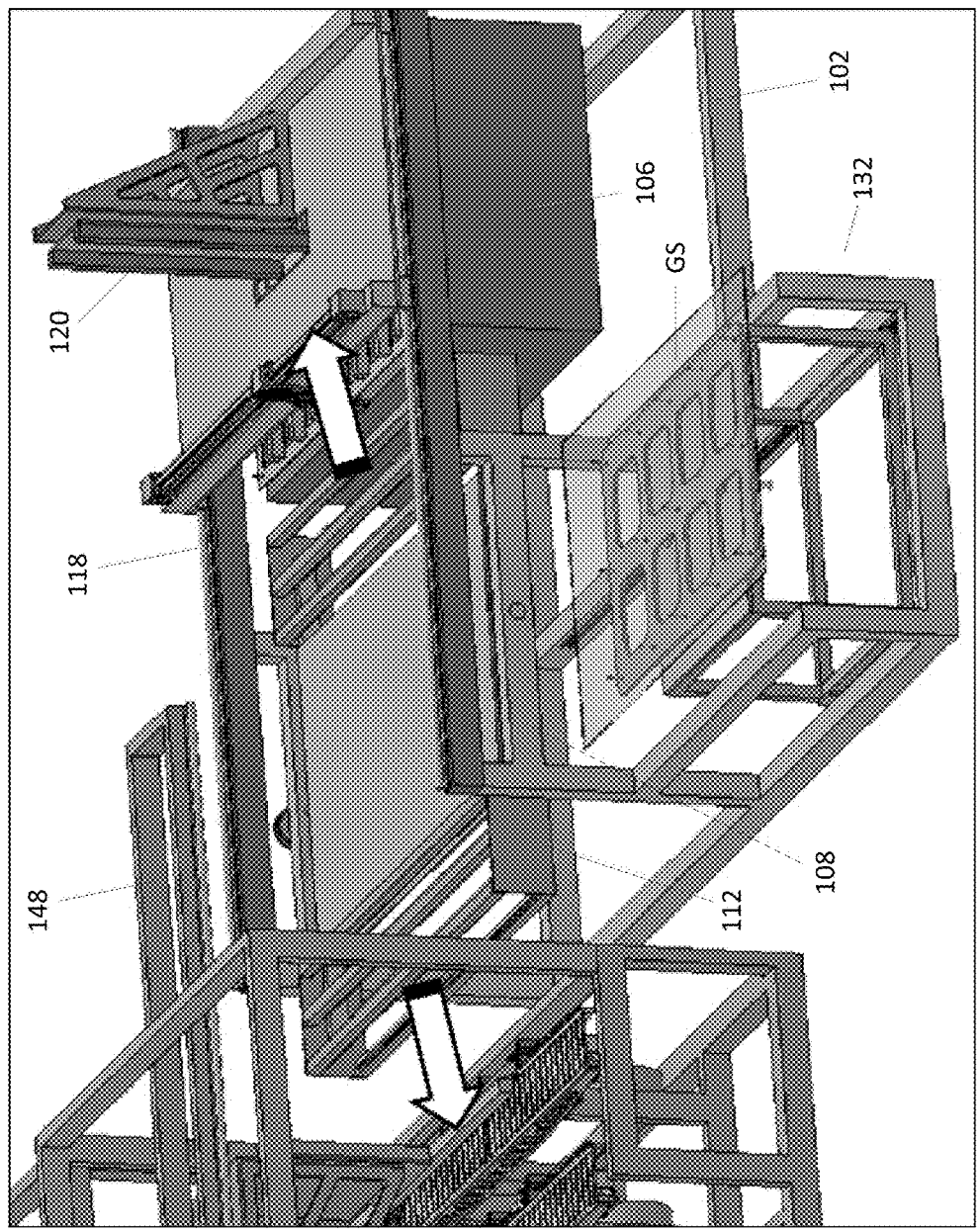

Examples of operation 310 are shown at FIGS. 15-17. Here, clamps 112 are operated to position clamps 112 over the back sheet BS and string(s) S. Airbags 114 are then inflated until airbags 114 contact string(s) S to hold string(s) S against back sheet BS, as shown at FIG. 15. Vacuum table 108 is then rotated 180 degrees until the previously upward facing string(s) S and back sheet BS are facing downward, as shown at FIG. 16. Airbags 114 are then deflated until airbags 114 no longer contact sting(s) S. Clamps 112 are then operated to position clamps 112 away from the back sheet BS and string(s) S, as shown at FIG. 17. During this time, back sheet BS is held against vacuum table to prevent back sheet BS from dropping.

With reference back to FIG. 10, at operation 312, the back sheet is released from the vacuum table onto a glass sheet such that the at least one string is between the back sheet and the glass sheet. Examples of operation 312 are shown at FIGS. 18-20.

Figure 18:
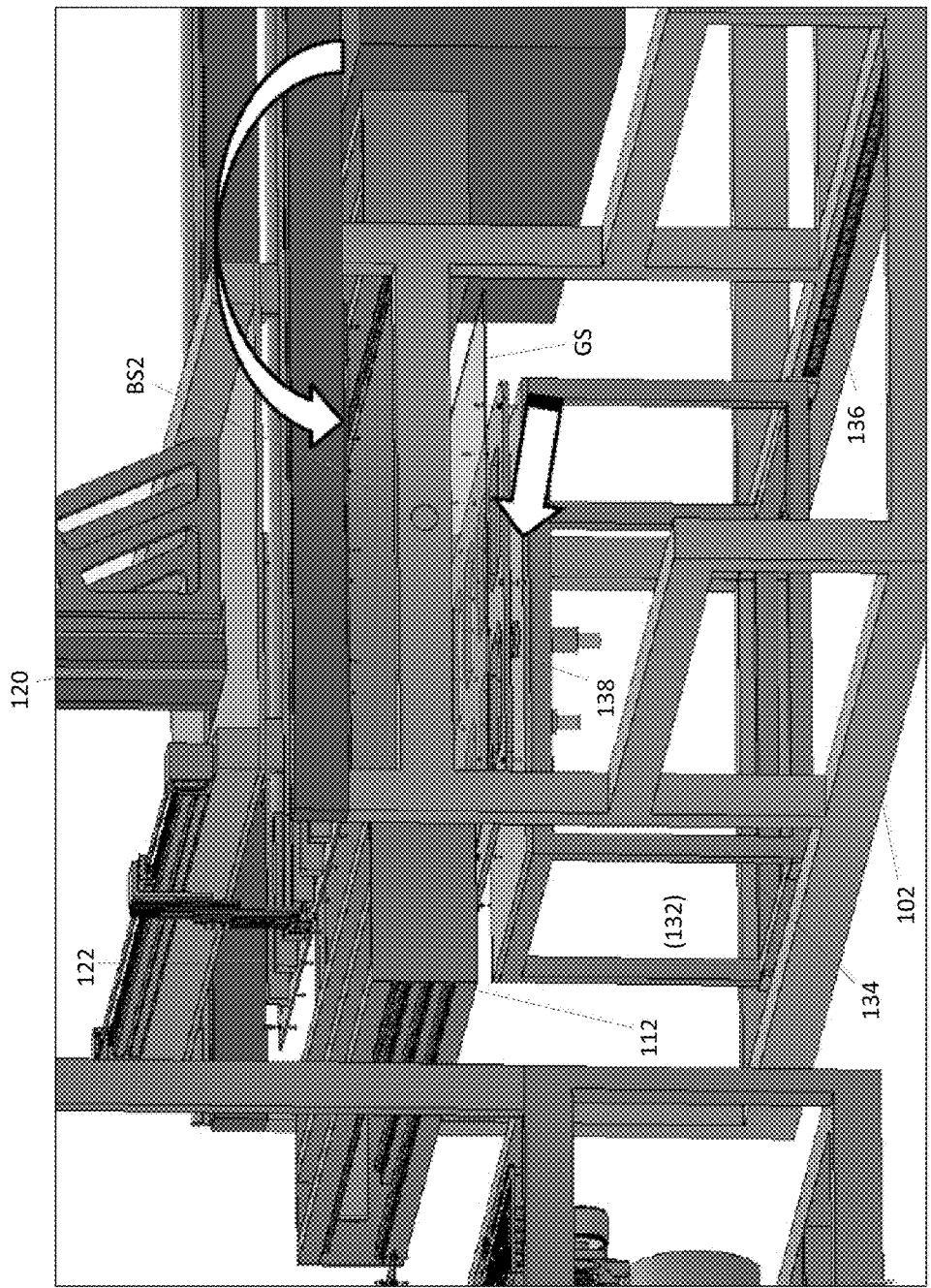
Figure 19:
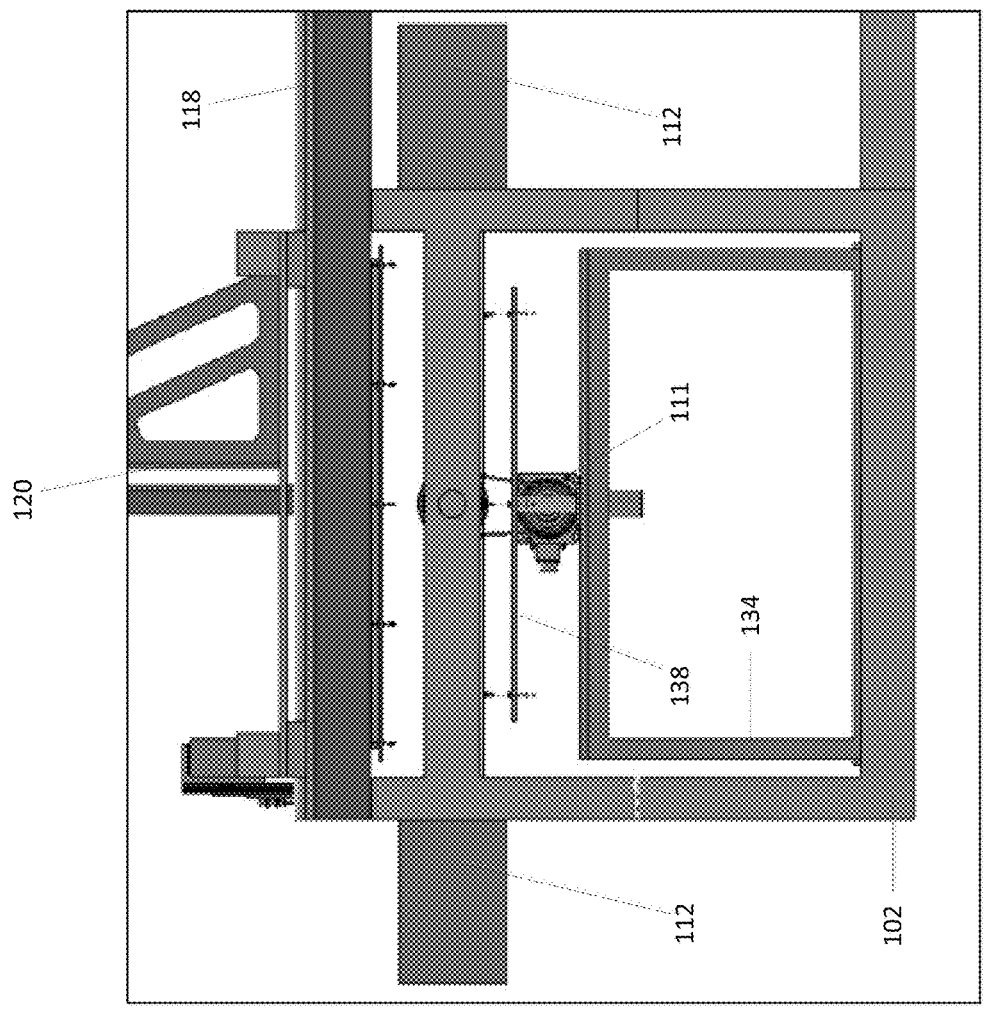
Figure 20:
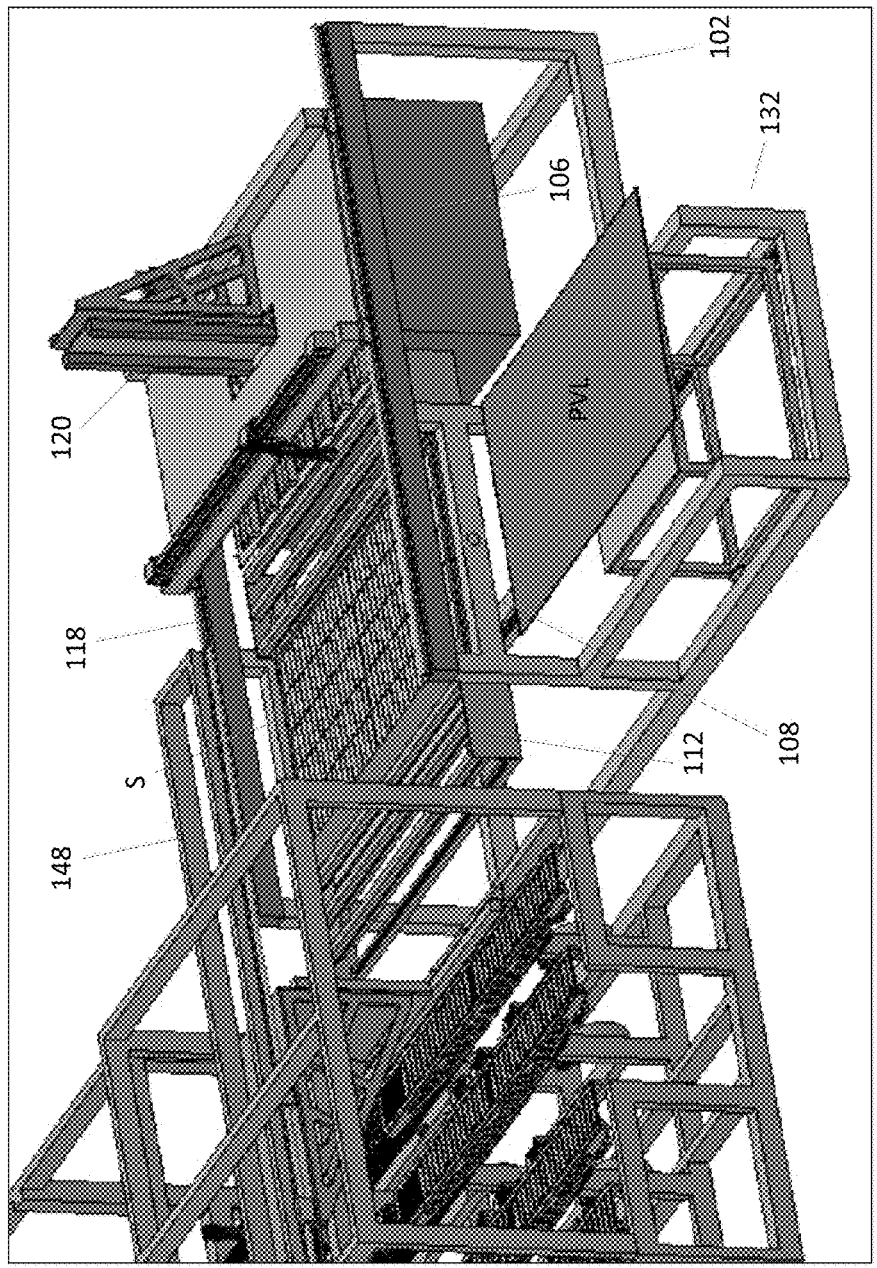

At FIGS. 18 and 19, glass sheet module 132 is operated to place moveable frame 134 and glass sheet tray 138 holding glass sheet GS underneath back sheet BS and string(s) S. In this position, back sheet BS and string(s) S onto glass sheet GS can be separated by a very small distance, such as less than 5 mm. Optionally, as shown at FIG. 18, operation 304 can be repeated to place second back sheet BS2 to the opposite side of vacuum table 108, such that method 300 can be performed again with some overlap of operations rather than completely iteratively. Then vacuum table 108 can be operated to cease suction against back sheet BS and drop back sheet BS and string(s) S onto glass sheet GS, thereby forming PV laminate PVL. At FIG. 20, glass sheet module 132 is operated to place moveable frame 134 and glass sheet tray 138 holding PV laminate PVL away from vacuum table 108 to allow vacuum table 108 freedom to rotate. PV laminate PVL can then be removed for assembly into a finished PV module.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Other variations are within the spirit of the present invention. Thus, while the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for constructing a photovoltaic (PV) substrate, the method comprising:
    moving a moving frame towards a stack of back sheets and securing a back sheet from the stack of back sheets to the moving frame;
    transferring the back sheet from the moving frame to a vacuum table;
    dispensing an adhesive to the back sheet using an adhesive dispenser;
    placing at least one string onto the adhesive applied to the back sheet;
    rotating the vacuum table; and
    releasing the back sheet from the vacuum table onto a glass sheet.

2. The method of claim 1, wherein moving the moving frame comprises lowering the moving frame by operating a hoist coupled to the moving frame to lower the moving frame towards the stack of back sheets until the moving frame comes into contact or near contact with a back sheet.

3. The method of claim 2, wherein the hoist is supported by a gantry bridge that is slidable between the stack of back sheets and the vacuum table.

4. The method of claim 3, wherein transferring the back sheet includes moving the gantry bridge to position the back sheet over the vacuum table.

5. The method of claim 3, wherein the adhesive dispenser is attached to the gantry bridge and wherein the gantry bridge is configured to move while dispensing adhesive to apply an adhesive pattern onto the back sheet.

6. The method of claim 1, wherein placing the at least one string onto the adhesive comprises retrieving the at least one string from a staging location using an overhead string picking hoist coupled to a staging gantry.

7. The method of claim 1, further comprising positioning heaters directly adjacent to the at least one string on the back sheet and heating the at least one string using the heater to initiate curing of the adhesive.

8. The method of claim 1, further comprising securing the at least one string against the back sheet by applying a clamp against the at least one string.

9. The method of claim 8, wherein the clamp comprises an air bag that is inflated against the at least one string.

10. The method of claim 1, wherein releasing the back sheet from the vacuum table comprises dropping the back sheet onto the glass sheet.

11. A system for constructing a photovoltaic (PV) substrate, the system comprising:
    a moving frame configured to pick and move a back sheet from a stack of back sheets;
    a vacuum table configured to receive the back sheet from the moving frame and apply suction to the back sheet, the vacuum table being rotatable such that back sheet can face downward or upward while applying suction to hold the back sheet;
    an adhesive dispenser configured for applying a pattern of adhesive to the back sheet when the back sheet is facing upward on the vacuum table;
    a string picking hoist configured to retrieve at least one string and move the at least one string onto the pattern of adhesive when the back sheet is facing upward on the vacuum table; and
    a glass sheet module configured to receive the back sheet, with the at least one string adhered to the back sheet, onto a sheet of glass when the back sheet is facing downward from the vacuum table.

12. The system of claim 11, further comprising a hoist coupled to the moving frame, the hoist being configured to lower the moving frame towards the stack of back sheets until the moving frame comes into contact or near contact with the back sheet.

13. The system of claim 12, wherein the hoist is supported by a gantry bridge that is slidable between the stack of back sheets and the vacuum table.

14. The system of claim 13, wherein the adhesive dispenser is attached to the gantry bridge.

15. The system of claim 11, wherein the string picking hoist is coupled to a staging gantry and is configured to retrieve the at least one string from a staging location and move the at least one string from to the vacuum table by movement of the staging gantry.

16. The system of claim 11, further comprising heaters attached to the moving frame, the heaters being configured to heat the at least one string using to initiate curing of the adhesive.

17. The system of claim 11, further comprising a clamp operable to secure the at least one string against the back sheet during rotation of the vacuum table.

18. The system of claim 17, wherein the clamp includes air bags that are inflated to press the at least one string against the back sheet.

19. The system of claim 11, wherein the vacuum table is configured to drop the back sheet and the at least one string onto the glass sheet positioned onto the glass sheet rack.

20. A method for constructing a photovoltaic (PV) substrate, the method comprising:
operating a hoist coupled to a moving frame to lower the moving frame towards a stack of back sheets until the moving frame comes into contact or near contact with a back sheet, the hoist being supported by a gantry bridge that is slidable between the stack of back sheets and a vacuum table;
applying suction to the back sheet using the moving frame to secure the back sheet to the moving frame and remove the back sheet from the stack of back sheets;
moving the gantry bridge to position the back sheet over the vacuum table;
applying suction to the back sheet using the vacuum table to transfer the back sheet from the moving frame to the vacuum table;
dispensing an adhesive to the back sheet using an adhesive dispenser attached to the gantry bridge;
retrieving at least one string from a staging location using an overhead string picking hoist coupled to a staging gantry;
moving the at least one string from the staging location to the back sheet at the vacuum table;
moving and releasing the at least one string onto the adhesive applied to the back sheet;
positioning heaters attached to the moving frame directly adjacent to the at least one string on the back sheet;
heating the at least one string using the heater to initiate curing of the adhesive;
securing the at least one string against the back sheet by applying a clamp against the at least one string;
rotating the vacuum table 180 degrees such that the at least one string and back sheet face downward;
unsecuring the at least one string from the clamp;
releasing the back sheet from the vacuum table onto a glass sheet such that the at least one string is between the back sheet and the glass sheet.

* * * * *